(12) United States Patent
Simin et al.

(10) Patent No.: US 10,586,890 B2
(45) Date of Patent: Mar. 10, 2020

(54) OPTO-ELECTRONIC DEVICE WITH TWO-DIMENSIONAL INJECTION LAYERS

(71) Applicant: Sensor Electronic Technology, Inc., Columbia, SC (US)

(72) Inventors: Grigory Simin, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 10 days.

(21) Appl. No.: 16/143,015

(22) Filed: Sep. 26, 2018

(65) Prior Publication Data

US 2019/0027650 A1   Jan. 24, 2019

Related U.S. Application Data

(63) Continuation of application No. 15/678,481, filed on Aug. 16, 2017, now Pat. No. 10,090,438.

(Continued)

(51) Int. Cl.
*H01L 29/06* (2006.01)
*H01L 33/24* (2010.01)
(Continued)

(52) U.S. Cl.
CPC .............. *H01L 33/24* (2013.01); *H01L 33/06* (2013.01); *H01L 33/08* (2013.01); *H01L 33/14* (2013.01);
(Continued)

(58) Field of Classification Search
CPC ......... H01L 33/24; H01L 33/06; H01L 33/08; H01L 33/14; H01L 33/32
See application file for complete search history.

(56) References Cited

U.S. PATENT DOCUMENTS 9,184,346 B2   11/2015   Lunev et al.
9,859,461 B2   1/2018    Shur et al.
(Continued)

OTHER PUBLICATIONS

Zhang, et al., "A charge inverter for III-nitride light emitting diodes," Applied Physics Letters, 2016, 6 pages.

(Continued)

*Primary Examiner* — Phuc T Dang
(74) *Attorney, Agent, or Firm* — LaBatt, LLC

(57) ABSTRACT

An opto-electronic device with two-dimensional injection layers is described. The device can include a semiconductor structure with a semiconductor layer having one of an n-type semiconductor layer or a p-type semiconductor layer, and a light generating structure formed on the semiconductor layer. A set of tilted semiconductor heterostructures is formed over the semiconductor structure. Each tilted semiconductor heterostructure includes a core region, a set of shell regions adjoining a sidewall of the core region, and a pair of two-dimensional carrier accumulation (2DCA) layers. Each 2DCA layer is formed at a heterointerface between one of the sidewalls of the core region and one of the shell regions. The sidewalls of the core region, the shell regions, and the 2DCA layers each having a sloping surface, wherein each 2DCA layer forms an angle with a surface of the semiconductor structure.

20 Claims, 13 Drawing Sheets

Related U.S. Application Data

(60) Provisional application No. 62/382,218, filed on Aug. 31, 2016.

(51) Int. Cl.
- *H01L 33/06* (2010.01)
- *H01L 33/08* (2010.01)
- *H01L 33/14* (2010.01)
- *H01L 33/20* (2010.01)
- *H01L 33/32* (2010.01)
- *H01L 33/40* (2010.01)
- *H01L 33/44* (2010.01)

(52) U.S. Cl.
CPC .............. *H01L 33/20* (2013.01); *H01L 33/32* (2013.01); *H01L 33/405* (2013.01); *H01L 33/44* (2013.01); *H01L 2933/0091* (2013.01)

(56) References Cited

U.S. PATENT DOCUMENTS

| | | |
|---|---|---|
| 2004/0099869 A1 | 5/2004 | Gaska et al. |
| 2007/0285000 A1* | 12/2007 | Lim .................. G02F 1/133603 313/501 |
| 2011/0309326 A1* | 12/2011 | Gaska ...................... H01L 33/04 257/13 |
| 2014/0200334 A1 | 7/2014 | Lake et al. |
| 2016/0163925 A1 | 5/2016 | Jo et al. |
| 2017/0159187 A1* | 6/2017 | Wu ........................ C23C 28/021 |

OTHER PUBLICATIONS

Zhang, et al., "A hole accelerator for InGaN/GaN light-emitting diodes," Applied Physics Letters, 2014, 6 pages.

Zhang, et al., "Interband tunneling for hole injection in III-nitride ultraviolet emitters," Applied Physics Letters, 2015, 6 pages.

Dang, P., U.S. Appl. No. 15/678,481, Notice of Allowance, dated May 22, 2018, 7 pages.

Dang, P., U.S. Appl. No. 15/678,481, Ex Parte Quayle Action, dated Feb. 28, 2018, 10 pages.

* cited by examiner

OPTO-ELECTRONIC DEVICE WITH TWO-DIMENSIONAL INJECTION LAYERS

REFERENCE TO RELATED APPLICATIONS

The present patent application is a continuation of U.S. application Ser. No. 15/678,481, filed on 16 Aug. 2017, now U.S. Pat. No. 10,090,438, which claims the benefit of U.S. Provisional Application No. 62/382,218, filed on 31 Aug. 2016, each of which is hereby incorporated by reference in its entirety to provide continuity of disclosure.

TECHNICAL FIELD

The present invention relates generally to opto-electronic devices such as for example, ultraviolet light emitting diodes (UV LEDs), and more particularly, to devices that include tilted semiconductor heterostructures having two-dimensional carrier accumulation (2DCA) layers for improved carrier injection.

BACKGROUND ART

A great deal of interest has been focused on UV LEDs and lasers, in particular those that emit light in the blue and deep ultraviolet (UV) wavelengths. These opto-electronic devices may be capable of being incorporated into various applications, including solid-state lighting, biochemical detection, high-density data storage, and the like.

A modern opto-electronic device, such as a UV LED, typically includes three major components: an electron supply layer (e.g., a n-type semiconductor layer), a hole supply layer (e.g., a p-type semiconductor layer), and a light generating structure formed between the electron supply layer and the hole supply layer. These UV LEDs are mainly fabricated from group III nitride heterostructures. Typically, a high level of p-type doping is necessary with the group III nitride materials used in these heterostructures in order to have efficient LED operation. Achieving the necessary p-type doping for efficient operation is a challenge due to high ionization energy of acceptor impurities in these group III nitride materials.

Several approaches have been used to attain the necessary p-type doping in these group III nitride based UV LEDs. In one approach, an additional $SiO_2$/semiconductor interface is used at the part of the UV LED where the hole accumulation layer is formed within a p-type layer. With this approach, the holes need to tunnel through the $SiO_2$/semiconductor interface to reach the light generating structure. The hole accumulation layer in this design can help increase the hole concentration, but the concentration of holes tunneling through the $SiO_2$/semiconductor interface is significantly lower than that in the hole accumulation layer. Also, adding the $SiO_2$/semiconductor interface in this design substantially increases the turn-on voltage of the UV LED device.

In another approach, a tunnel junction formed between two group III nitride layers is used for hole injection into the light generating structure. In this approach, a high electron concentration in the top group III nitride layer causes carrier tunneling through the tunnel junction and reduces the lateral spreading resistance. However, this design does not allow for significant improvement in the hole injection into the light generating structure. In a third approach, a hole acceleration layer is used with the UV LED device structure. In particular, a group III nitride layer and a group III nitride barrier form a region with strong electric field enhancing the hole emission over the barrier. This approach results in excessive voltage drop across the additional barrier without any significant increase in the hole injection into the light generating structure. All of these design approaches for group III nitride based UV LEDs lack the capability to enable high carrier concentration in the light generating structure due to high ionization energy of the doped group III nitride materials.

SUMMARY OF THE INVENTION

This summary of the invention introduces a selection of certain concepts in a brief form that are further described below in the detailed description of the invention. It is not intended to exclusively identify key features or essential features of the claimed subject matter set forth in the claims, nor is it intended as an aid in determining the scope of the claimed subject matter.

Aspects of the present invention are directed to improving carrier injection in opto-electronic devices such as for example, UV LEDs. Improved carrier injection is obtained in the various embodiments of the present invention by forming two-dimensional gas (2DG) layers at a heterointerface between two materials with different compositions in order to enhance hole/electron injection efficiency.

In one embodiment, a set of tilted semiconductor heterostructures is formed over a semiconductor structure which can include an n-type semiconductor layer or a p-type semiconductor layer, and a light generating structure formed on the semiconductor structure. Each tilted semiconductor heterostructure can include a core region and a set of shell regions each adjoining a sidewall of the core region. The tilted semiconductor heterostructure also include a set of two-dimensional carrier accumulation (2DCA) layers, with each 2DCA layer formed at a heterointerface between one of the sidewalls of the core region and one of the shell regions.

The core region and the shell regions of each of the tilted semiconductor heterostructures can include a combination of different materials selected from group III-V elements. In one embodiment, the core region and shell regions can include group III nitride elements such that a concentration of at least one of the group III nitride elements in the core region is different from a concentration of that group III nitride element in the pair of shell regions. In one example, the group III nitride elements in the core region and shell regions can include a material represented by the $Al_xGa_{1-x}N$ system, wherein the pair of shell regions have different compositions of Al than the composition of Al in the core region. In one embodiment, the core region can contain a higher concentration of Al than the concentration of Al in the pair of shell regions. In one embodiment, the pair of shell regions can have a different composition of AlN than the composition of AlN in the core region, wherein the core region contains a higher concentration of AlN than the concentration of AlN in the pair of shell regions.

The combination of different materials in each of the tilted semiconductor heterostructures, between the core region and the shell regions, form a 2DG layer at an interface between the combination of different materials. In particular, a 2DG is formed in each of the 2DCA layers separating a side of the core region with one of the shell regions. Depending on the semiconductor structure, the 2DG layer can include either a two-dimensional hole gas (2DHG) or a two-dimensional electron gas (2DEG). For example, if the semiconductor structure includes an electron blocking layer, then 2DHGs can be formed in the 2DCA layers between the core region and the shell regions. Alternatively, if the semiconductor structure includes a hole blocking layer, then 2DEGs can be formed in the 2DCA layers between the core region and the shell regions.

In each tilted semiconductor heterostructure, the sidewalls of the core region, the pair of shell regions, and the pair of 2DCA layers have a sloping surface, such that each 2DCA layer forms an angle with a surface of the semiconductor structure. The efficient injection of holes from the 2DCA layers to the light generating structure in the semiconductor structure is a function of the angle formed between each of the 2DCA layers and the surface of the semiconductor structure. In one embodiment, an angle that ranges from 30 degrees to 60 degrees has been determined to provide efficient carrier injection.

The tilted semiconductor heterostructures can be formed from an assortment of shapes and sizes (e.g., height, thickness, etc.) having tilted surfaces. In one embodiment, the tilted semiconductor heterostructures have a conical shape. Other shapes can include, but are not limited to, structures having inclined shapes, e.g., at least one inclined side, such as a trapezoid. In one embodiment, the tilted semiconductor heterostructures formed over the semiconductor structure can include heterostructures with different shapes and sizes.

A supply electrode can be formed over the tilted semiconductor heterostructures. In one embodiment, the pairs of the 2DCA layers in each of the tilted semiconductor heterostructures can contact the light generating structure of the semiconductor structure and the supply electrode to form injection zones for charge carriers. In this manner, a source applied to the supply electrode can drive holes/electrons from the heterostructures into the light generating structure in the semiconductor structure for electron-hole pair recombination and light emission therefrom. Depending on the polarity of the tilted semiconductor heterostructures, the supply electrode can form an anode or a cathode to the device. For example, if the tilted semiconductor heterostructures are p-type, then the supply electrode can form an anode. Alternatively, if the tilted semiconductor heterostructures are n-type, then the supply electrode can form a cathode. In one embodiment, one or both electrodes (one formed at the top of the device and one at the bottom) which can form the anode and cathode can include transparent contacts.

In one embodiment, a doped semiconductor layer can be formed between the tilted semiconductor heterostructures and the supply electrode. To this extent, the doped semiconductor layer and the tilted semiconductor heterostructure can form a multi-layered structure. This doped semiconductor layer facilitates the electric contact between the supply electrode and the 2DCA layers in each of the tilted semiconductor heterostructures by reducing the total resistance of the device. In one embodiment, the doped semiconductor layer can include discontinuous sections of the doped semiconductor layer. In this manner, each discontinuous section of the doped semiconductor layer can be formed on one of the tilted semiconductor heterostructures.

Each of the tilted semiconductor heterostructures can be separated from immediately adjacent heterostructures by a predetermined spacing. The amount of spacing between each of the tilted semiconductor heterostructures can vary depending on the application of the device. For example, in sensing applications, the spacing between the tilted semiconductor heterostructures can be increased to permit gases and/or liquids to travel therethrough and contact the surface of the semiconductor structure. The spacing between the tilted semiconductor heterostructures can also have a role in enabling the device to achieve a targeted total output of optical power. For example, in a scenario where the tilted semiconductor heterostructures are used to form an optoelectronic device having an array of UV LEDs, the device can generate a higher total output of optical power if the spacing between heterostructures is smaller because more heterostructures can be configured in the array.

In one embodiment, the shell regions of each tilted semiconductor heterostructure can include a plurality of compositional layers formed on the sidewalls of the core region that extend laterally away from the core region. Each compositional layer can have a different composition from an immediately adjacent compositional layer. In this manner, a 2DG layer can be formed between each of the compositional layers. The compositional layers can include group III-V materials. In one embodiment, the group III-V material can include a material represented by the $Al_xGa_{1-x}N$ system. In one embodiment, each of the layers can include a different composition of Al. In another embodiment, each of the layers can include a different composition of AlN.

A core region of the tilted semiconductor heterostructures that is surrounded by compositional layers can include a multilayered structure of horizontally extending layers. In one embodiment, the multilayered structure can include a short period superlattice (SPSL) having a set of barriers alternating with a set of quantum wells. The SPSL can be transparent to a targeted radiation at a normal incidence to the SPSL. In one embodiment, the barriers and the quantum wells of the SPSL can include alternating $Al_xGa_{1-x}N$/$Al_yGa_{1-y}N$ pairs, with each layer within a pair including a thin semiconductor layer having a thickness ranging from 0.5 nm to 20 nm.

In one embodiment, ohmic contacts can be formed over the tilted semiconductor heterostructures. For example, each ohmic contact can be formed on one of the tilted semiconductor heterostructures, such that the ohmic contact extends along a top surface of the core region and the set of shell regions and down a side portion of each shell region.

In one embodiment, a dielectric layer can be formed in the spaces between each of the tilted semiconductor heterostructures for passivation. The dielectric layer can be transparent to a targeted radiation at a normal incidence to the dielectric layer. A reflective metallic contact can also be formed over the ohmic contacts and the dielectric layer. The reflective properties of the reflective metallic contact can be improved by depositing Bragg mirrors between the tilted semiconductor heterostructures before forming the metallic contact. Another embodiment can include adding light scattering elements in the dielectric layer that scatter light that is at least 10% Lambertian. In one embodiment, another SPSL having a set of barriers alternating with a set of quantum wells, and a graded semiconductor layer can be formed between the tilted semiconductor heterostructures and the semiconductor structure.

The compositional layers that surround the sides of the core region of tilted semiconductor heterostructures can include a graded composition of material. This graded composition, in addition to the formation of the 2DG at the interface of the layers can result in polarization doping of the tilted semiconductor heterostructures that can include either p-type doping or n-type doping. The graded composition provides control of the spreading of the 2DG within the compositional layers. The graded composition of material can vary in the compositional layer in a vertical direction, a lateral direction or a combination of both the vertical direction and the lateral direction.

Besides controlling electrical properties, the materials of the compositional layers as well as the thicknesses of the layers can be selected to control the optical properties of the tilted semiconductor heterostructures. For example, in one embodiment, the compositional layers in the tilted semiconductor heterostructures can form Bragg reflectors. In another embodiment, the compositional layers in the tilted semiconductor heterostructures can form graded refractive index structures to improve light extraction. In these embodiments, the core region of each tilted semiconductor heterostructure can be transparent to a targeted radiation at a normal incidence to the core region.

In one embodiment, the tilted semiconductor heterostructures can include a tilted nanowire. In this implementation, each tilted nanowire can include a core region and shell regions surrounding the sides of the core region, with a 2DCA layer formed between the interface of the core region and each shell region. The core region and the shell regions can have different compositions of materials, which form the 2DGs in each of the 2DCA layers at the interface between the different materials. Each of the nanowires can be epitaxially grown under an angle with respect to a surface of the light generating structure of the semiconductor structure. In this manner, direct contact between the 2DHGs and the supply electrode as well as between the 2DHGs and the light generating structure can be attained to facilitate efficient carrier injection. An angle that ranges from 30 degrees to 60 degrees will provide efficient carrier injection for these nanowires.

A first aspect of the invention provides a device, comprising: a semiconductor structure having a semiconductor layer including one of an n-type semiconductor layer or a p-type semiconductor layer, and a light generating structure formed on the semiconductor layer; and a plurality of tilted semiconductor heterostructures formed over the semiconductor structure, each tilted semiconductor heterostructure separated from an adjacent tilted semiconductor heterostructure by a predetermined spacing, each tilted semiconductor heterostructure including a core region, a set of shell regions, each shell region adjoining a sidewall of the core region, and a set of two-dimensional carrier accumulation (2DCA) layers, each 2DCA layer formed at a heterointerface between one of the sidewalls of the core region and one of the shell regions, the sidewalls of the core region, the set of shell regions and the set of 2DCA layers each having a sloping surface, wherein each 2DCA layer forms an angle with a surface of the semiconductor structure, the angle ranging from 30 degrees to 60 degrees.

A second aspect of the invention provides a device, comprising: a substrate; an n-type semiconductor layer formed over the substrate; a light generating structure formed on the n-type semiconductor layer; a plurality of spaced conically-shaped p-type heterostructures formed over the light generating structure, each conically-shaped p-type heterostructure including a core region and a set of shell regions each adjoining a sidewall of the core region, wherein a two-dimensional hole gas (2DHG) layer is formed at a heterointerface between each of the sidewalls of the core region and the shell regions, the sidewalls of the core region, the set of shell regions, and the 2DHG layers each having a tilted surface that slopes increasingly inward from a bottom surface of the core region, the pair of shell regions, and the 2DHGs to a top surface thereof, wherein the heterointerface forms an angle with a surface of the light generating structure, the angle ranging from 30 degrees to 60 degrees; and a supply electrode formed over the plurality of conically-shaped p-type heterostructures.

A third aspect of the invention provides an opto-electronic device, comprising: an ultraviolet transparent substrate; an n-type semiconductor layer formed over the ultraviolet transparent substrate, the n-type semiconductor layer having an $Al_xGa_{1-x}N$ composition; a light generating structure formed on the n-type semiconductor layer, the light generating structure including a plurality of barriers alternating with a plurality of quantum wells, the plurality of barriers and the plurality of quantum wells having an $A_{I_x}Ga_{1-x}N$ and $Al_yGa_{1-y}N$ composition, respectively, with x<y; a p-type semiconductor structure formed over the light generating structure, the p-type semiconductor structure including at least one layer including a set of tilted semiconductor heterostructures, each tilted semiconductor heterostructure separated from an adjacent tilted semiconductor heterostructure by a predetermined spacing and having a lateral area that is no larger than 20% of a lateral area of the light generating structure, each tilted semiconductor heterostructure having an $Al_xGa_{1-x}N$ composition, each tilted semiconductor heterostructure including a core region and a set of shell regions, each shell region adjoining a sidewall of the core region, wherein the core region includes a first AlN molar ratio and each of the shell regions surrounding the core region include a second AlN molar ratio, the first AlN molar ratio being greater than the second AlN molar ratio.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
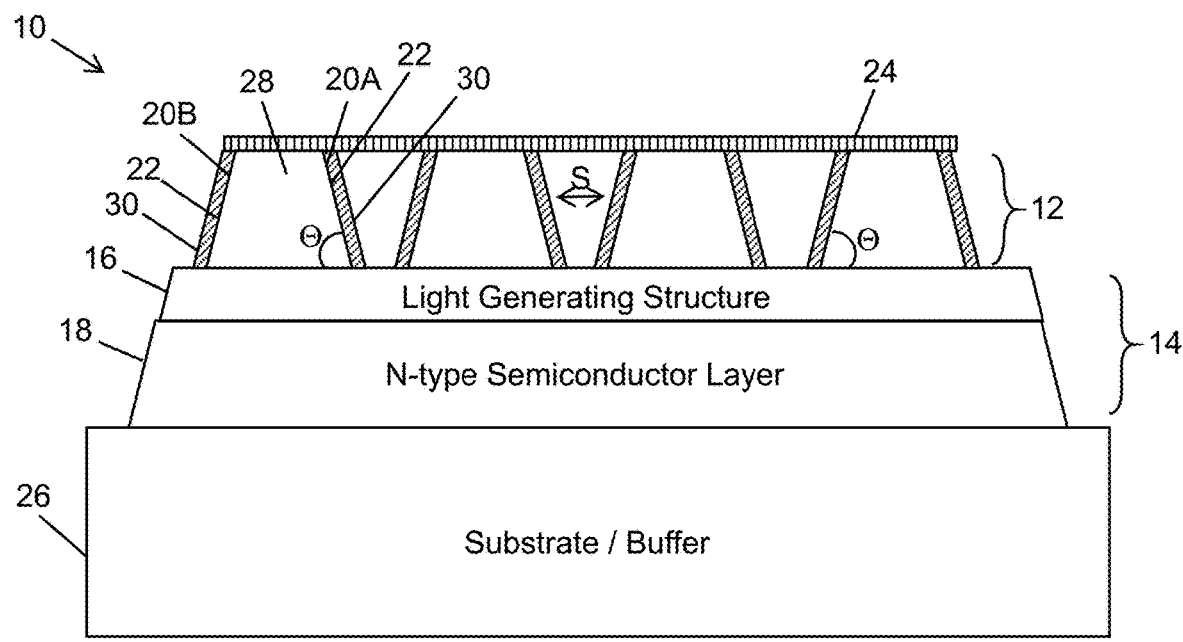
FIG. 1 shows a cross-sectional view of an opto-electronic device having a set of tilted semiconductor heterostructures formed over a semiconductor structure having a light generating structure and an n-type semiconductor layer, in which each heterostructure includes 2DG layers at a heterointerface between two materials with different compositions according to an embodiment.

The various embodiments are directed to improving carrier injection in opto-electronic devices such as UV LEDs. Improved carrier injection is obtained in the various embodiments of the present invention by forming 2DG layers at a heterointerface between two materials with different compositions. In one embodiment, a set of tilted semiconductor heterostructures can be formed over a single or multi-layered semiconductor structure having a light generating structure. Each of the tilted semiconductor heterostructures can include a core region and a set of shell regions that each adjoin a sidewall of the core region. The core region and the set of shell regions can include different compositions of the same material. The heterointerface between the core region and the shell regions leads to the formation of 2DG layers at the interface between the two materials with different compositions.

As used herein, an opto-electronic device can include any light emitting device or solid state lighting source (SSLS) that uses one or more of any diode that under normal operating conditions can generate radiation. More specifically, the opto-electronic device can include any light emitting device or SSLS that uses semiconductor LEDs. Examples of semiconductor LEDs can include, but are not limited to, UV LEDs, conventional and super luminescent LEDs, light emitting solid state lasers, laser diodes of various types, and/or the like. These examples of semiconductor LEDs can be configured to emit electromagnetic radiation from a light generating structure such as an active region upon application of a bias. The electromagnetic radiation emitted by these semiconductor LEDs can comprise a peak wavelength within any range of wavelengths, including visible light, ultraviolet radiation, deep ultraviolet radiation, infrared light, and/or the like. For example, these semiconductor LEDs can emit radiation having a dominant wavelength within the ultraviolet range of wavelengths. As an illustration, the dominant wavelength can be within a range of wavelengths of approximately 210 nanometers (nm) to approximately 350 nm.

Any of the various layers that form the opto-electronic device can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the active region of the opto-electronic device (e.g., peak emission wavelength+/−five nanometers). As used herein, a layer is transparent to radiation if it allows more than approximately five percent of the radiation to pass there through, while a layer can also be considered to be transparent to radiation if it allows more than approximately ten percent of the radiation to pass there through in a more particular embodiment. Defining a layer to be transparent to radiation in this manner is intended to cover layers that are considered transparent and semi-transparent.

A layer of the opto-electronic device can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

Turning to the drawings, FIG. 1 shows a cross-sectional view of an opto-electronic device 10 having a set of tilted semiconductor heterostructures 12 formed over a semiconductor structure 14 having a light generating structure 16 and an n-type semiconductor layer 18, in which each heterostructure 12 includes 2DG layers 20A, 20B at each heterointerface 22 between two materials with different compositions according to an embodiment. As used herein, a tilted semiconductor heterostructure means a heterostructure having at least one heterointerface that is positioned such that the normal direction drawn to the heterointerface is not parallel to the growth direction. FIG. 1 shows that the set of tilted semiconductor heterostructures 12 can be formed between the light generating structure 16 and a supply electrode 24, while the n-type semiconductor layer 18 of the semiconductor structure 14 can be formed on a substrate/buffer 26. In one embodiment, the set of tilted semiconductor heterostructures 12 can comprise a plurality of domains each domain having lateral area that is smaller than a lateral area of the light generating structure 16. In a more particular embodiment, each domain has a maximum lateral area that is no larger than 20% of a lateral area of the light generating structure 16.

Each tilted semiconductor heterostructure 12 can be separated from an adjacent tilted semiconductor heterostructure by a predetermined spacing S (as measured at the base of each heterostructure 12). In an embodiment, the spacing between the heterostructures 12 is filled with a dielectric, such as ambient air. Furthermore, each tilted semiconductor heterostructure 12 can include a core region 28, a set of shell regions 30 (shown as a pair of opposing shell regions 30), with each shell region adjoining a sidewall of the core region. In one embodiment, each shell region 30 laterally surrounds the core region 28 at least over 10% of the core region lateral boundary. In an embodiment, the shell regions 30 are part of a single shell region that completely surrounds a lateral area of the core region 28. A pair of two-dimensional carrier accumulation (2DCA) layers are formed at each heterointerface 22 that includes a 2DG layer 20A, 20B. In particular, each 2DCA layer is formed between one of the sidewalls of the core region 28 and one of the shell regions 30.

As shown in FIG. 1, the sidewalls of the core region 28, the pair of shell regions 30 and the pair of 2DCA layers at the heterointerface 22 each have a sloping surface. Each 2DCA layer at the heterointerface 22 forms an angle $\theta$ with a surface of the semiconductor structure 14 (e.g., the light generating structure 16). In one embodiment, the angle $\theta$ can range from 30 degrees to 60 degrees. As illustrated, the angle $\theta$ can be measured in any polar direction. While the angle $\theta$ is shown as being the same for each tilted semiconductor heterostructure 12, it is understood that the angles $\theta$ can vary for different polar directions of a heterostructure 12 and/or between the different heterostructures 12.

The tilted semiconductor heterostructures can be formed from any combination of one or more of an assortment of shapes and sizes (e.g., height, thickness, etc.) having tilted surfaces. In one embodiment, as shown in FIG. 1, the tilted semiconductor heterostructures 12 can have a conical shape. Other shapes can include, but are not limited to, pyramids of various cross-sectional shapes.

The substrate/buffer 26 is illustrated in FIG. 1 as one element, however, it is understood that the substrate and buffer can comprise separate elements. In one embodiment, the set of tilted semiconductor heterostructure 12 and the semiconductor structure 14 including the light generating structure 16 and the n-type semiconductor layer 18 can be formed on a buffer layer, which can be formed on the substrate. In other embodiments, it is understood that the opto-electronic device 10 may not include a substrate/buffer 26.

In one embodiment, the substrate can include sapphire, silicon carbide (SiC), silicon (Si), GaN, GaAs, AlGaN, AlON, LiGaO$_2$, InP, AlN, AIII-BV or AIIBVI compounds, SiO$_2$, Si$_3$N$_4$, diamond or other suitable material, and the buffer layer can include AlN, an AlGaN/AlN superlattice, and/or the like. In one embodiment, the substrate can include a non-conductive or insulating substrate. Examples of a non-conductive or insulating substrate can include highly-resistive silicon, insulating SiC, sapphire, diamond, a dielectric material, organic materials, and/or the like.

The semiconductor structure 14 can include a single or multi-layered structure having the light generating structure 16. In the embodiment depicted in FIG. 1, the semiconductor structure 14 is a multi-layer structure including the light generating structure 16 and the n-type semiconductor layer 18. The light generating structure 16 can form the active region of the opto-electronic device 10. In one embodiment, the light generating structure can include a multi-quantum well structure having a set of barrier layers alternating with a set of well layers. In the embodiment depicted in FIG. 1, the n-type semiconductor layer 18 can form an electron supply layer, while the set of tilted semiconductor heterostructures 12 can form a hole supply layer. In this manner, the light generating structure 16, the n-type semiconductor layer 18, and the set of tilted semiconductor heterostructures 12 form a heterostructure within the opto-electronic device 10 that serves as the active p-n junction region for electron-hole pair recombination and light emission.

The supply electrode 24, which can be a metal electrode, acts as the anode side of the opto-electronic device 10. In one embodiment, the supply electrode 24 can form a transparent contact to the set of tilted semiconductor heterostructures 12 which is generally a p-type semiconductor structure. A source (not shown) applied to the supply electrode 24 can drive electrons from the n-type semiconductor layer 18 to the light generating structure 16 and holes in the 2DCA layers at the heterointerfaces 22 of the tilted semiconductor heterostructures 12 to the light generating structure 16 for electron-hole pair recombination and light emission therefrom.

The light generating structure 16, the n-type semiconductor layer 18 and the set of tilted semiconductor heterostructures 12 of the electro-optical device 10 can form a group III-V materials based-device, in which some or all of the various layers are formed of elements selected from the group III-V materials system that can be grown on the substrate/buffer 26 by epitaxial or other methods. In a more particular illustrative embodiment, the various layers of the light generating structure 16, the n-type semiconductor layer 18 and the set of tilted semiconductor heterostructures 12 can be formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials can include binary, ternary and quaternary alloys such as, AlN, GaN, InN, GaAs, GaInAs, GaInP, BN, AlGaN, AlInGaN, AlInN, AlBN, AlGaInN, AlGaBN, AlInBN, and AlGaInBN with any molar fraction of group III elements. It is understood that this other group III nitride materials are fully applicable and that this illustrative list is not meant to limit the scope of the various embodiments.

An illustrative embodiment of a group III nitride based light generating structure 18 that includes a multi-quantum well (e.g., a series of alternating quantum wells and barriers) can comprise $In_y Al_x Ga_{1-x-y} N$, $Ga_z In_y Al_x B_{1-x-y-z} N$, an $Al_x Ga_{1-x} N$ semiconductor alloy, or the like. In one embodiment, the light generating structure 16 can include a set of quantum wells and barriers having an $A_{l_x} Ga_{1-x} N$ and an $Al_y Ga_{1-y} N$ composition respectively, with x<y.

Similarly, both the n-type semiconductor layer 18 and the set of tilted semiconductor heterostructures 12 and can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers of the light generating structure 16, the n-type semiconductor layer 18, and the set of tilted semiconductor heterostructures 12. In one embodiment, the n-type semiconductor layer 18 can include an $Al_x Ga_{1-x} N$ semiconductor layer having n-type doping that functions as an n-type contact layer.

As noted above, each of the titled semiconductor heterostructures 12 can include regions having materials with different compositions. In particular, the core region 28 and the pair of shell regions 30 of the tilted semiconductor heterostructures can include materials with different compositions. Having the core region 28 and the pair of shell regions 30 with materials of different compositions leads to the realization of the 2DG layers 20A, 20B having carrier densities at least $10^{11}$ carriers per square centimeters at each heterointerface 22, and thus, the formation of the 2DCA layers.

The core region 28 and the pair of shell regions 30 can include any of the aforementioned group III-V materials. In one embodiment, the group III-V material for the core region 28 and the pair of shell regions 30 can include a group III nitride material. For example, the group III nitride material can be represented by the $Al_x Ga_{1-x} N$ system. In one embodiment, the pair of shell regions 30 can have a different composition of AlN than the composition of AlN in the core region 28. For example, the core region 28 can contain a higher molar fraction of AlN than the pair of shell regions 30. For example, the molar fraction of AlN can be at least five percent higher for the core region 28 as compared to the shell region(s) 30.

It is understood that other group III-V materials can be used for the core region 28 and the shell regions 30. Furthermore, it is understood that combinations of these other group III-V materials for the core region 28 and the shell regions 30 can be used to attain the 2DG layers 20A, 20B at the heterointerfaces 22, and thus the formation of the 2DCA layers. Accordingly, the example of using the $Al_x Ga_{1-x} N$ system to represent the core region 28 and the shell regions 30 is not meant to limit the scope of the various embodiments described herein. Other group III nitride material systems are equally applicable as are any systems representing group III-V materials.

FIG. 1 shows that the tilted features of the semiconductor heterostructures 12 include having the tilted surface of the sidewalls of the core region 28, the pair of shell regions 30 and the pair of 2DCA layers formed at the heterointerfaces 22 slope increasingly inward from a surface of the light generating structure 16 of the semiconductor structure 14 to a surface of the supply electrode 24. These tilted features allow the 2DG layers 20A, 20B, and thus the 2DCA layers, to contact both a surface of the light generating structure 16 and the supply electrode 24. This eliminates highly resistive regions that normally occur in horizontally laid out heterostructures. By not incorporating layers with high vertical resistance, the opto-electronic device 10 can have improved p-type conductivity, and as a result, increased efficiency and reliability. It is understood that these tilted features are illustrative of only one configuration and that the tilted semiconductor heterostructures of this embodiment as well as others described herein can include other representations of surfaces that slant or tilt. Furthermore, these tilted can be effectuated by etching or any other available methods.

In operation, a source applied to the supply electrode 24 can drive electrons from the n-type semiconductor layer 18 to the light generating structure 16 and holes in the 2DCA layers at the heterointerfaces 22 of the tilted semiconductor heterostructures 12 to the light generating structure 16 for electron-hole pair recombination and light emission therefrom. In this embodiment, because holes are injected from the set of the tilted semiconductor structures 12, the 2DCA layers formed at the 2DG layers 20A, 20B of the heterointerfaces of different compositions of material, act as two-dimensional hole accumulation (2DHA) and two-dimensional hole gas (2DHG) layers. It is understood that, while not shown for clarity, the device 10 will further include an electrode to the n-type layer 18.

Injection of the electrons from the n-type semiconductor layer 18 and holes from the 2DHA and 2DHG layers in this embodiment and other described herein leads to improved carrier injection. In particular, improved carrier injection can be due to high mobility of the 2DHG.

Figure 2:
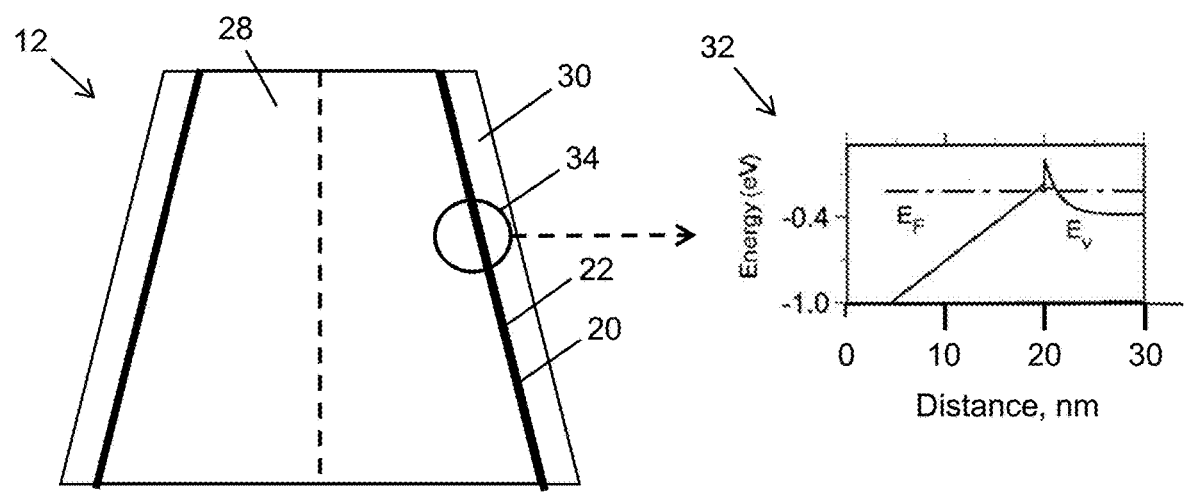
FIG. 2 shows a more detailed cross-sectional view of one of the tilted semiconductor heterostructures depicted in FIG. 1 along with a qualitative band diagram showing the formation of one of the 2DG layers at the heterointerface between the two materials with different compositions according to an embodiment.

FIG. 2 shows a more detailed cross-sectional view of one of the tilted semiconductor heterostructures 12 depicted in FIG. 1 along with a qualitative band diagram 32 showing the formation of one of the 2DG layers 20 at the heterointerface 22 between the two materials with different compositions according to an embodiment. In particular, the qualitative band diagram 32 of FIG. 2 plots electron potential energy versus distance along the heterointerface 22 where the 2DG layer 20 is formed, between one sidewall of the core region 28 and one of the shell regions 30.

The qualitative band diagram 32 is representative of an embodiment in which the core region 28 and the shell regions 30 are formed of group III nitride materials that include AlGaN. In this embodiment, the core region 28 includes a high concentration of Al, while the shell regions 30 include a low concentration of Al. The qualitative band diagram 32 of FIG. 2 corresponds to a 20% Al composition difference between the core region 28 and the shell regions 30. As shown in FIG. 2, the qualitative band diagram exhibits a spike in the electron potential energy at a point 34 on the heterointerface 22 that corresponds to a distance of 20 nm from the core center. This spike is indicative of a hole accumulation layer that results from an interface of semiconductor layers with different polarization. Note that the qualitative band diagram 32 does not take into account the tilted features of the core region 28, the shell regions 30, the heterointerface 22, and the 2DG layer 20, which as explained herein, improves the carrier injection of an opto-electronic device that utilizes such tilted semiconductor heterostructures 12 having heterointerfaces of material with different compositions.

Figure 3:
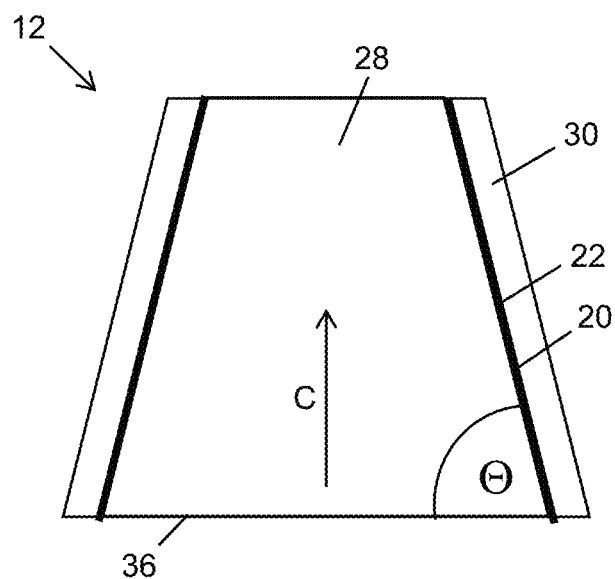
FIG. 3 shows another detailed cross-sectional view of one of the tilted semiconductor heterostructures with an angle formed between one of the 2DG layers and a bottom surface of the heterostructure according to an embodiment.

FIG. 3 shows another detailed cross-sectional view of one of the tilted semiconductor heterostructures 12 with the angle θ formed between one of the 2DG layers 20 and a bottom surface 36 of the heterostructure according to an embodiment. As noted above, the core region 28 of the tilted heterostructure 12 can include a different composition of a group III-V material than that of the shell regions 30. In an embodiment in which the core region 28 and the shell regions include a group III nitride material, the core region 28 can have a different composition of one of the elements in this material than that element in the shell regions 30. For example, if the core region 28 and the shell regions 30 include AlGaN, then the core region can have a higher concentration of Al than the concentration of Al in the shell regions. Also, as discussed herein and further shown in FIG. 3, the sidewalls of the core region 28, the pair of shell regions 30 and the pair of 2DCA layers formed at the heterointerface 22 in the 2DG layers 20 each have a sloping surface. Each 2DCA layer at the heterointerface 22 forms the angle θ with the surface 36 which is formed on the light generating structure 16 of the semiconductor structure 14. The angle θ is depicted in FIG. 3 with respect to the C-axis which is a crystal axis and is parallel to the epitaxial growth direction.

Figure 4:
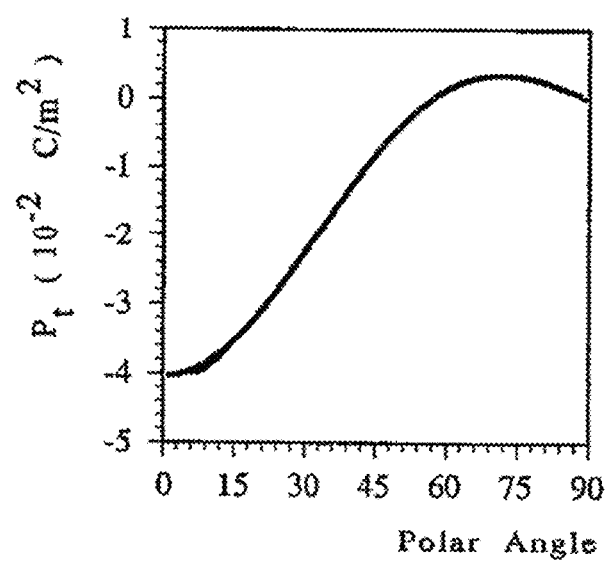
FIG. 4 illustrates the relationship between the angle depicted in FIG. 3 and the amount of polarization charge that is induced at the heterointerface between the two materials with different compositions according to an embodiment.

Generally, the polarization charges that occur at a heterointerface between group III nitride layers will depend on several factors. For example, the polarization charges will typically depend on the layer composition (e.g., Al, In and Ga), the strain between the layers at the heterointerface, as well as the layer orientation with respect to the growth direction. Conventional devices, such as for example, high electron mobility transistors, are typically formed using layers with their surfaces perpendicular to the C-axis of the material because this produces the strongest polarization charges. As the angle between the perpendicular to the heterointerface plane and the C-axis increases, the polarization changes. FIG. 4 illustrates the relationship between the polarization of a surface and its dependence upon a polar angle θ. FIG. 4 shows that as the angle θ increases from 0 degrees to approximately 60 degrees, the absolute value of polarization will decrease from approximately $4 \times 10^{12}$ cm$^{-2}$ to nearly zero.

The inventors to the various embodiments described herein have determined that an opto-electronic device, such as a UV LED, will provide efficient carrier (i.e., hole or electron) injection if the angle θ between the heterointerface plane of the tilted heterostructure 12 and the C-axis of the material growth direction is within a certain range. Using FIG. 4 as a guideline, and assuming that highly efficient carrier injection occurs if the 2DG layer 20 decreases by no more than 3 times as compared to the horizontally laid out heterostructures 12 (zero angle between the C-direction and the perpendicular to the surface of the heterostructure), the tilting angle θ of the heterostructure depicted in FIGS. 1 and 3 can range from 30 degrees to 60 degrees. In a narrower embodiment, the tilting angle θ of the heterostructure does not exceed approximately 45 degrees.

Referring back to the detailed view of the tilted heterostructure 12 of FIG. 2, in this example as noted with regard to the applicable embodiment of FIG. 1, the heterostructure is part of a set that forms a hole supply layer of the opto-electronic device 10. As a result, the 2DG layers 20 form 2DHG layers so that hole injection occurs in part at the "injection zones" formed by a direct contact between the 2DHG layers and the light generating structure 16 of the semiconductor structure 14. It is understood that while holes in 2DHG along the heterointerface 20 can be injected through injection zones, some holes can be also injected through the core region 28 and even through the shell region 30.

If the angle θ of the heterostructure were changed, then such a change would lead to variations in the 2DHG density and the distances of injection zones between locations along the 2DHG and the light generating structure 16 into which the holes are injected. For example, smaller values of the angle θ will lead to a higher 2DHG density at the heterointerface 22, but also result in larger distances between the injection zones. Accordingly, those skilled in the art will appreciate that the selection of the angle θ that is used for the embodiments described herein as well as any opto-electronic devices that incorporate the features of the tilted semiconductor heterostructures 12 will depend on a multitude of factors. For example, the angle θ that is selected can depend on the shape and sizes (e.g., thickness) of the tilted semiconductor heterostructures 12, and the total size of the active region that forms the light generating structure 16. Other factors can include, but are not limited to, other properties of an opto-electronic device that are not directly related to p-type conductivity. For example, if the opto-electronic device comprises an LED or a photo-detector, the angle θ can be chosen to improve light extraction efficiency (in case of an LED) or photon absorption (in case of a photo-diode).

Figure 5:
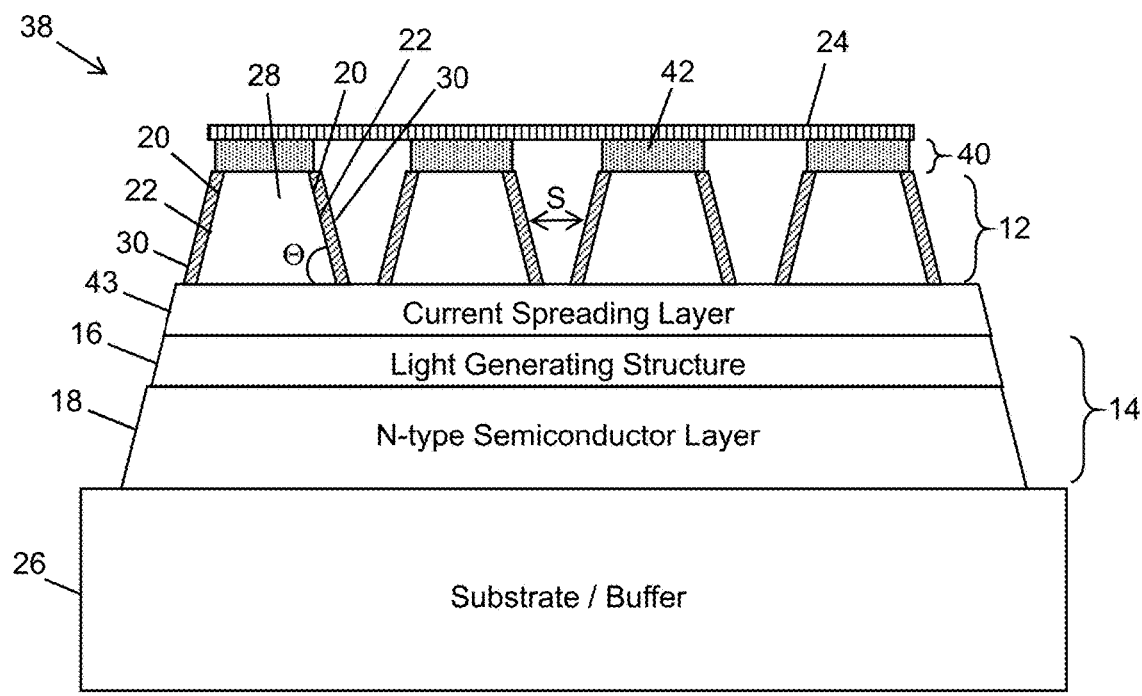
FIG. 5 shows a cross-sectional view of an opto-electronic device having a doped semiconductor layer formed between the set of tilted semiconductor heterostructures and a supply electrode according to an embodiment.

FIG. 5 shows a cross-sectional view of an opto-electronic device 38 that is similar to the opto-electronic device 10 of FIG. 1. In addition to the components identified with like reference numerals, the opto-electronic device 38 of FIG. 5 includes a doped semiconductor layer 40 formed between the set of tilted semiconductor heterostructures 12 and the supply electrode 24 according to an embodiment. The doped semiconductor layer 40, which can be a single layer or a multi-layered structure, can facilitate the electric contact between the supply electrode 24 and the 2DCA layers in each of the tilted semiconductor heterostructures 12 in order to reduce the total resistance of the opto-electronic device 38. As illustrated in FIG. 5, the doped semiconductor layer 40 can include discontinuous sections 42 of the doped semiconductor layer. In one embodiment, each of the discontinuous sections 42 of the doped semiconductor layer 40 can be formed on one of the tilted semiconductor heterostructures 12. The spacing between the discontinuous sections 42 can be filled with a dielectric, such as ambient air.

The doped semiconductor layer 40 can include one of multitude of materials. For example, the doped semiconductor layer 40 can include, but is not limited to, $Al_xB_yIn_zGa_{1-x-y-z}N$ layer with $0 \le x$, y, $z \le 1$ and $0 \le 1-x-y-z$ In general, the molar fractions x, y, and z are chosen to yield a material with high p-type conductivity. For example, in an embodiment the molar fractions can comprise x=y=z=0, resulting in a GaN semiconductor. In an alternative embodiment, the doped semiconductor layer can comprise a superlattice $Al_{x1}B_{y1}In_{z1}Ga_{1-x1-y1-z1}N/Al_{x2}B_{y2}In_{z2}Ga_{1-x2-y1-z2}N$ of layers where the molar fractions x1, y1, z1, x2, y2, z2 are selected to result in a structure having barriers and quantum wells within the superlattice.

In the embodiment of FIG. 5, because the tilted semiconductor heterostructure 12 acts as a hole layer as noted with regard to the applicable embodiment of FIG. 1, the doped semiconductor layer 40 can be a p-type doped semiconductor layer. An additional p-type doped semiconductor layer inserted between the supply electrode 24 and the hole injection structure of the tilted semiconductor heterostructures 12, can facilitate the electric contact between the supply electrode 24 and the 2DHG layers, thus reducing the total resistance of the device 38.

In one embodiment, an opto-electronic device can include a current spreading semiconductor layer 43, which can be epitaxially grown between the light generating structure 16 and the set of tilted semiconductor heterostructures 12. For example, a p-type current spreading semiconductor layer 43 can be epitaxially grown between the light generating structure 16 and the set of tilted semiconductor heterostructures 12. In one embodiment, the thickness of the current spreading layer, as well as the lateral and vertical conductivity of the layer, and the spacing between the tilted semiconductor heterostructures 12 can be used to attain a certain current density variation. For example, the thickness, the lateral conductivity, and the vertical conductivity of the current spreading layer 43, along with the largest spacing between the heterostructures 12, can be used to attain a p-type current density variation in the set of tilted semiconductor heterostructures that is at most 200% between any two points at the current spreading layer 43 and the light generating structure 16. In another embodiment, a p-type current spreading semiconductor layer can be epitaxially grown between the light generating structure 16 and the set of tilted semiconductor heterostructures 12. In this embodiment, the largest distance between the tilted semiconductor heterostructures 12 can be selected to be no larger than the current spreading length in the p-type current spreading semiconductor layer.

Figure 6:
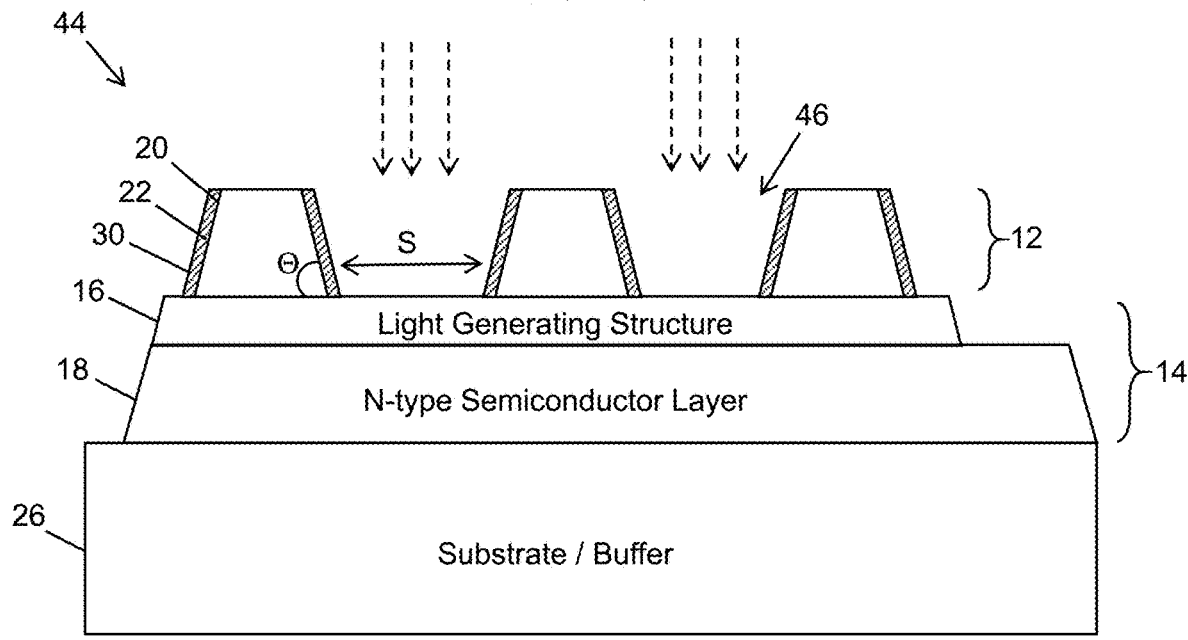
FIG. 6 shows the opto-electronic device of FIG. 1 having increased spacing between each of the tilted semiconductor heterostructures for use in sensing applications in which gases and/or liquids are permitted to travel therethrough and contact the surface of the semiconductor structure according to an embodiment.

FIG. 6 shows a cross-sectional view of an opto-electronic device 44 that is also similar to the opto-electronic device 10 of FIG. 1. In addition to the components identified with like reference numerals, the opto-electronic device 44 of FIG. 6 differs from the device 10 of FIG. 1, in that the predetermined spacing S between the set of tilted semiconductor heterostructures 12 is increased. This increased spacing between each of the tilted semiconductor heterostructures 12 can be used in sensing applications in which gases and/or liquids are permitted to travel through these spaces and contact a surface of the light generating structure 16 in the semiconductor structure 14. In essence, the spaces between the tilted semiconductor heterostructures 12 form sensing regions 46 in the opto-electronic device 44 that allow it to perform sensing functions. While not shown for clarity, it is understood that one or more surfaces of the opto-electronic device 44 can be encapsulated to protect the gases and/or liquids from contacting these surfaces.

The predetermined spacing S between the tilted semiconductor heterostructures 12 can vary depending on the intended sensing applications for the opto-electronic device 44. In one embodiment, a spacing that ranges from a few tens of nanometers (e.g., approximately 30 nm) to a few tens of microns (e.g., approximately 30 microns) is generally sufficient to permit gases and/or liquids to travel there through and contact the surface of the light generating structure 16. It is understood that spacing selection is likely to be limited by the equipment needed for photolithography and etching, as such approaches can be used to produce the tilted semiconductor heterostructures described herein. In an alternative embodiment, the tilted semiconductor heterostructures can be epitaxially grown to produce tilted nano-structures having a shell-core structure described herein.

It is understood that the amount of spacing S between the tilted semiconductor heterostructures 12 can a have role in the operating characteristics of the opto-electronic device. In particular, the spacing between the tilted semiconductor heterostructures 12 can also have a role in enabling the opto-electronic device 44 to achieve a targeted total output of optical power. For example, in a scenario where the tilted semiconductor heterostructures 12 are used to form an opto-electronic device having an array of UV LEDs, the device can generate a higher total output of optical power if the spacing S between the heterostructures is smaller because more heterostructures can be configured in an array of the same lateral size.

Figure 7:
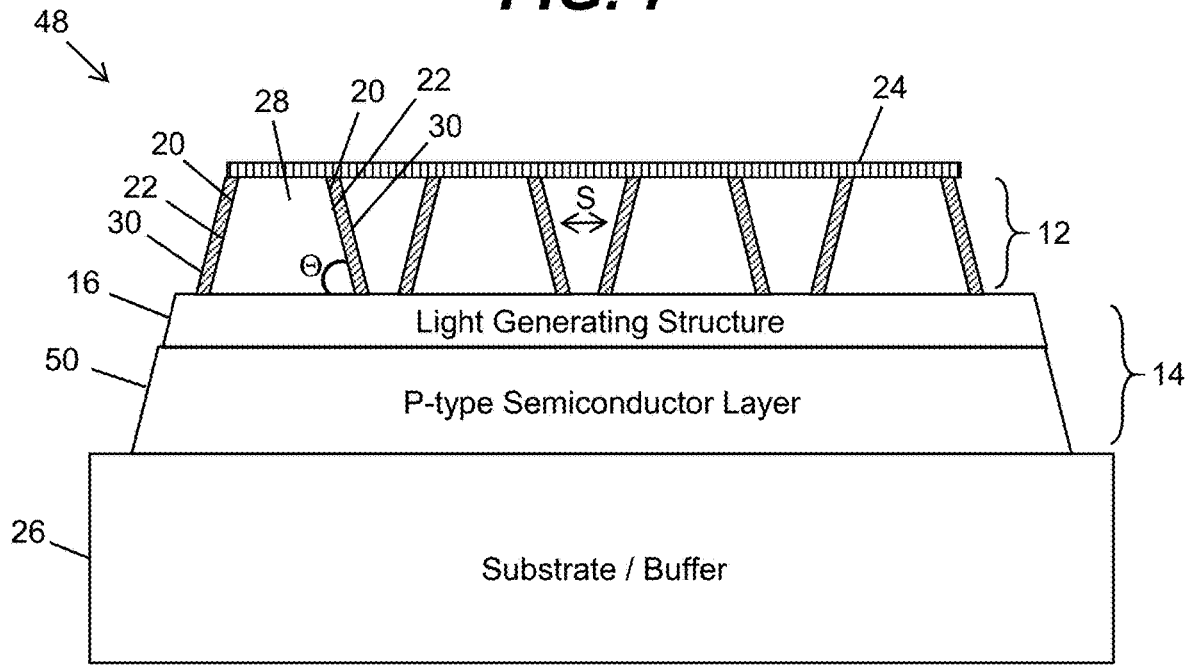
FIG. 7 shows a cross-sectional view of an opto-electronic device having a set of tilted semiconductor heterostructures formed over a semiconductor structure having a light generating structure and a p-type semiconductor layer, in which each heterostructure includes 2DG layers at a heterointerface between two materials with different compositions according to an embodiment.

FIG. 7 shows a cross-sectional view of an opto-electronic device 48 that is similar to the opto-electronic device 10 of FIG. 1 and the opto-electronic device 38 of FIG. 5, except the opto-electronic device 48 is a flipped version of the embodiments depicted in FIGS. 1 and 5. In particular, FIG. 7 shows a cross-sectional view of the opto-electronic device 48 having the set of tilted semiconductor heterostructures 12 formed over the semiconductor structure 14 having the light generating structure 16 and a p-type semiconductor layer 50 in which each heterostructure includes 2DG layers at the heterointerface 22 between two materials with different compositions according to an embodiment.

In this embodiment, the set of tilted semiconductor heterostructures 12 act as the electron supply layer while the p-type semiconductor layer 50 underneath the light generating structure 16 acts as the hole supply layer, and the supply electrode 24 forms the cathode of the opto-electronic device 48. The anode of the opto-electronic device 48 is not shown for clarity. As a result, the 2DG layer 20 formed at the heterointerfaces 22 between the core region 28 and the shell regions 30 becomes a 2DEG layer in each heterostructure 12. In this manner, electron injection occurs at the injection zones formed by the direct contact between the 2DEG layers and the light generating structure 16 of the semiconductor structure 14. For example, in operation, a source applied to the supply electrode 24 can drive electrons from the heterostructures 12 into the light generating structure 16 along with the holes from the p-type semiconductor layer 50 for electron-hole pair recombination and light emission.

Figure 8:
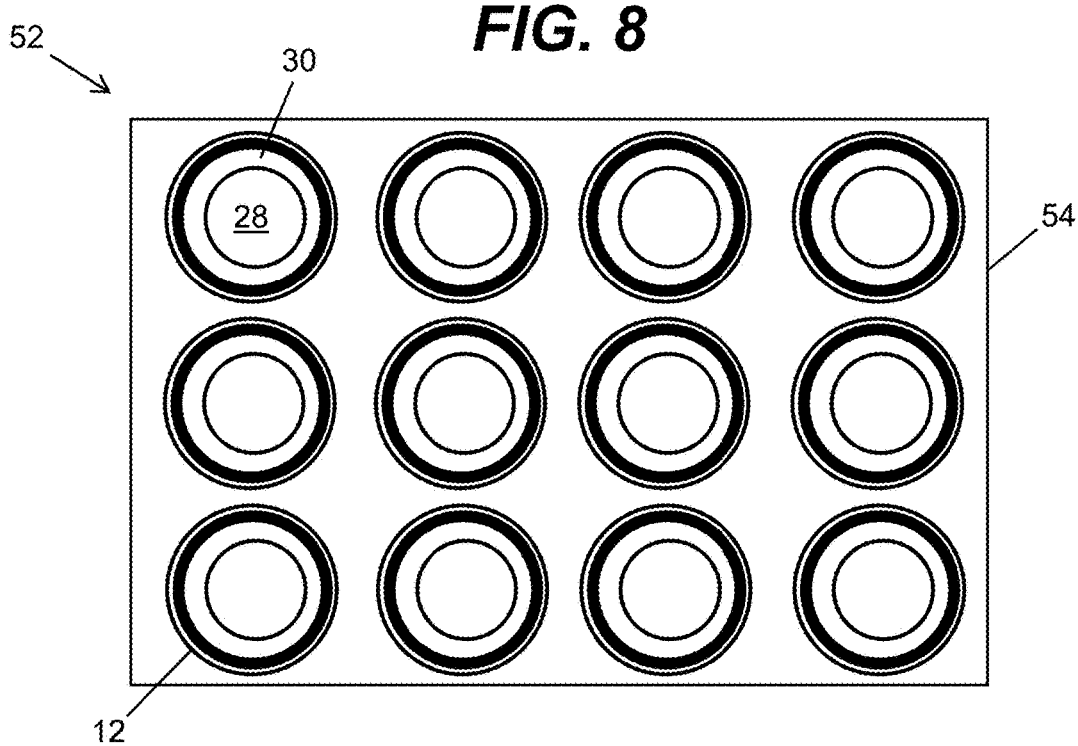
FIG. 8 shows a schematic of an opto-electronic device forming an array of pixels in which the pixels take the form of the tilted semiconductor heterostructures described herein according to an embodiment.

FIG. 8 shows a schematic of an opto-electronic device 52 according to an embodiment in which the set of tilted semiconductor heterostructures 12 are formed in an array 54 of rows and columns. In one embodiment, the array 54 of tilted semiconductor heterostructures 12 can take the form of an ultraviolet lamp. In this manner, each the tilted semiconductor heterostructures 12 can act as a LED each having the aforementioned 2DCA layers with the 2DHG or 2DEG injection structure. This allows the array 54 of semiconductor heterostructures 12, which each function as the individual pixels.

Although not represented in the top view of FIG. 8, it is understood that beneath each of the tilted semiconductor heterostructures 12 would be the other elements that enable the heterostructures to act as a LED such as, but not limited to, the light generating structure 16 and the underlying electron supply layer or hole supply layer. In one embodiment, the array 54 of tilted semiconductor heterostructures 12 can operate as lasers. In still another embodiment, the array 54 of tilted semiconductor heterostructures 12 can operate as a combination of LEDs and lasers. As illustrated, the tilted semiconductor heterostructures can include a core region 28 that is at least partially or completely laterally surrounded by the shell region 30.

Figure 9:
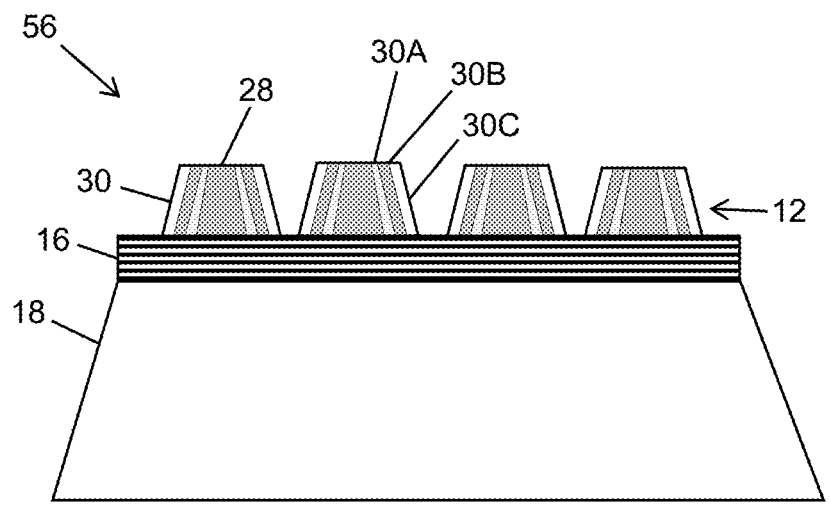
FIG. 9 shows a cross-sectional view of an opto-electronic device having a set of tilted semiconductor heterostructures in which each heterostructure includes a core region with a set of shell regions adjoining the sidewalls of the core region, wherein the shell regions include a set of compositional layers according to an embodiment.

FIG. 9 shows a cross-sectional view of an opto-electronic device 56 having a set of tilted semiconductor heterostructures 12 in which each heterostructure includes a core region 28 with a set of shell regions 30 adjoining the sidewalls of the core region, wherein each shell region includes a plurality of compositional layers (30A, 30B, 30C) according to an embodiment. As shown in FIG. 9, the compositional layers (30A, 30B, 30C) can be formed on the sidewall of the core region 28 and extend laterally away from the core region. In one embodiment, each compositional layer (30A, 30B, 30C) can have a different composition from an immediately adjacent compositional layer. For example, the compositional layers 30A, 30B, and 30C, which can include any of the aforementioned group III-V materials can have different composition of material. In one embodiment, the compositional layers 30A, 30B, and 30C can differ by the composition of at least one of the elements in the group III-V material used for these layers. For example, the compositional layers 30A, 30B, and 30C can each have a different composition of Al. In one embodiment, the set of tilted semiconductor heterostructures can have compositional layers with different molar fractions of the group III-V material at the heterointerfaces of the layers. For example, some of the compositional layers can have lower molar fractions of AlN, while other compositional layers can have higher molar fractions of AlN at the heterointerfaces of the layers. In one embodiment, the difference in composition or molar ratio of AlN between any of the adjacent compositional layers is at least 1%. The doping concentration of the compositional layers can be varied, and in some instances, the doping is selected to be delta doping at least some distance away from the heterointerface.

The difference in composition between the compositional layers 30A, 30B, and 30C causes a 2DG to be formed at the heterointerface between each of the layers, layers having different composition. In the embodiment depicted in FIG. 9, the 2DG formed at the heterointerfaces between each of the compositional layers 30A, 30B, and 30C is a 2DHG layer because the set of tilted semiconductor heterostructures 12 act as a hole supply layer and the n-type semiconductor layer 18 underneath the light generating structure 16 functions as the electron supply layer. For example, the compositional layer 30A can have a first composition and the compositional layer 30B can have a second composition resulting in the heterointerface between layers 30A and 30B having a 2DHG.

The use of multiple compositional layers at the shell region 30 that adjoin the core region 28 and extend laterally away from the sidewall of the core region can be advantageous over other embodiments which only depict the exterior shell regions having a single layer. For example, multiple shells allow for several injection zones, thus increasing the injection of holes into an active region.

It is understood for embodiments in which a p-type semiconductor layer is used underneath the light generating structure 16 in place of the n-type semiconductor layer 18, and the set of tilted semiconductor heterostructures 12 act as an electron supply layer, the 2DG layers formed at the interfaces of the compositional layers 30A, 30B, and 30C would include 2DEG layers. Also, the number of compositional layers 30A, 30B, and 30C is only illustrative of one design option and it is understood that the each of the tilted semiconductor heterostructures 12 can have more or less compositional layers than that depicted in FIG. 9.

Figure 10:
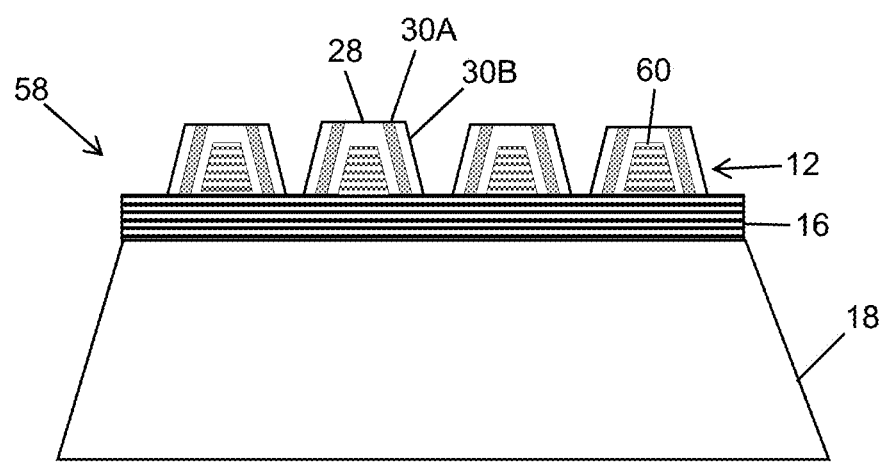
FIG. 10 shows a cross-sectional view of an opto-electronic device having a set of tilted semiconductor heterostructures in which each heterostructure includes a core region with a set of shell regions adjoining the sidewalls of the core region, wherein the core region includes a multi-layered structure and the shell regions include a set of compositional layers according to an embodiment.

FIG. 10 shows a cross-sectional view of an opto-electronic device 58 that is also similar to the opto-electronic device 56 of FIG. 9, although any combination of one or more of the unique features shown can be implemented on any embodiment described herein. In addition to the components identified with like reference numerals, the opto-electronic device 58 of FIG. 10 differs from the device 56 of FIG. 9, in that the core region 28 of each tilted semiconductor heterostructure includes a multilayered structure 60 that is surrounded by the compositional layers (30A and 30B) of the shell region 30. As shown in FIG. 10, the multilayered structure 60 can include a structure of horizontally extending layers. In one embodiment, the multilayered structure 60 can include a short period superlattice (SPSL) having a plurality of barriers alternating with a plurality of quantum wells. To this extent, the SPSL can be transparent to a targeted radiation at a normal incidence to the SPSL. In one embodiment, the barriers and quantum wells of the SPSL can include alternating $Al_xGa_{1-x}N/Al_yGa_{1-y}N$ pairs, with each layer within a pair including a thin semiconductor layer having a thickness ranging from 0.5 nm to 20 nm. The composition of x and y of the SPSL in this embodiment can be selected to result in relative transparency of the SPSL to the target radiation with an acceptable conductivity of such a SPSL structure.

In the embodiment depicted in FIG. 10 in which the set of tilted heterostructure semiconductors act as the hole supply layer, the multilayered structure 60 in the core region 28 can be p-type doped with a doping profile that is selected to optimize the conductivity of the SPSL. For example, the doping of the multilayered structure 60 can be selected such that the barriers layers within the SPSL are heavily doped in the proximity of SPSL quantum wells. In particular, the barriers layers within the SPSL are the layers with a wider bandgap, and thus will have a higher molar fraction of the material used for the SPSL layers (e.g., AlN). It is these barrier layers that can be heavily doped, while the quantum well layers of the SPSL have the narrow bandgap and lower molar fraction of the material used (e.g., AlN). It is understood that the barriers and quantum wells of the SPSL can include alternating layers of other group III nitride material besides AlN, as well as group III-V materials as discussed herein.

The use of a multilayered structure 60 in the core region 28 such as a SPSL structure and the shell region 30 that adjoin the core region 28 and extend laterally away from the sidewall of the core region can be advantageous over other embodiments which only include a core region without a multi-layered structure. For example, a multilayered structure can promote injection of holes from 2DHG into a core region. In addition, the multilayered structure can be doped to result in hole conductivity across such a structure. Furthermore, such a structure can comprise partially transparent and partially reflective layer that can be beneficial for the efficiency of the opto-electronic device.

Figure 11:
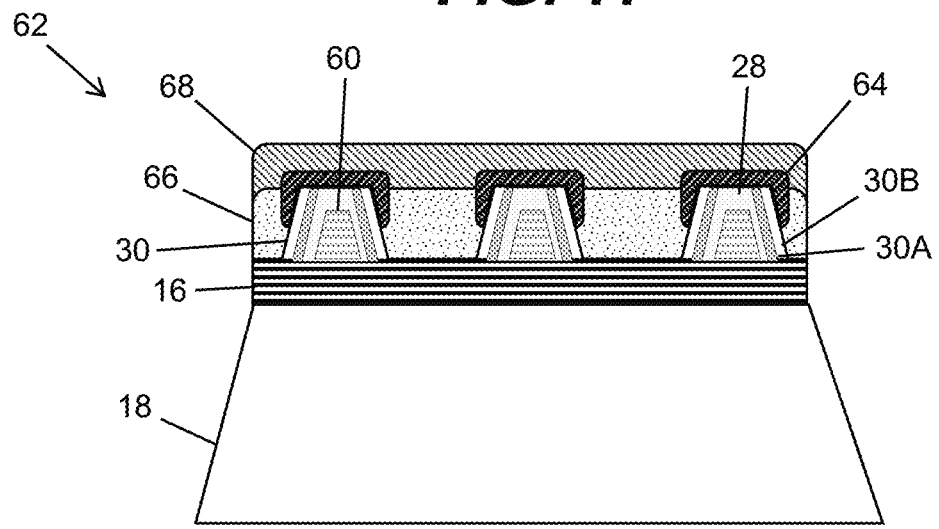
FIG. 11 shows an alternative to the opto-electronic device of FIG. 10 in which a set of ohmic contacts is formed over the tilted semiconductor heterostructures, a dielectric layer is formed in between the heterostructures, and a reflective metallic contact is formed over the ohmic contacts and the dielectric layer according to an embodiment.

FIG. 11 shows a cross-sectional view of an opto-electronic device 62 that is also similar to the opto-electronic device 58 of FIG. 10, although any combination of one or more of the unique features shown can be implemented on any embodiment described herein. In this embodiment, the opto-electronic device 62 includes a set of ohmic contacts 64 formed over the set of tilted semiconductor heterostructures 12 that provide an increased surface for improved p-type metal-to-semiconductor contact. As shown in FIG. 11, each ohmic contact 64 is formed on one of the tilted semiconductor heterostructures 12. In one embodiment, each ohmic contact 64 extends along a top surface of the core region 28 and the set of shell regions 30 including the compositional layers (30A and 30B) and down a side portion of each shell region and the compositional layers. Although the ohmic contacts 64 are shown extending down a limited portion of the sides of the shell regions 30 and the compositional layers 30A and 30B, it is understood that the extent to which the ohmic contacts 64 cover these sides is variable, and thus the implementation depicted in FIG. 11 is only illustrative and not meant to limit the various embodiment described herein.

The ohmic contacts 64 can be formed from a material that is transparent and reflective to a target radiation. For example, the ohmic contacts 64 can be formed from materials that include, but are not limited to, Ni, Rd, Pd, Pt, and/or Ru, followed by Al. The ohmic contacts 64 can also be formed from multiple layers of any of the above materials. In one embodiment, the ohmic contacts 64 can be formed from several metallic layers.

For example, the ohmic contacts 64 can include a first layer that includes a transparent nickel layer, a second layer that includes a metal diffusion protective layer, followed by a third layer that includes a reflective layer. U.S. patent application Ser. No. 13/711,675, titled "Ultraviolet Reflective Contact," and on filed Dec. 12, 2012 provides more detail of such an ohmic contact that includes several metallic layers, and is hereby incorporated by reference.

The opto-electronic device 62 can further include a dielectric layer 66 formed in the spaces between each of the tilted semiconductor heterostructures 12 for passivation of the device. In one embodiment, the dielectric layer 66 is formed in the spaces between each of the tilted semiconductor heterostructures 12 such that the dielectric adjoins the portions of the shell regions 30 and the compositional layers 30A, 30B that are not covered by the ohmic contacts 64. As shown in FIG. 11, the dielectric layer 66 can be formed to adjoin against a portion of the ohmic contacts 64 that extend along the side portion of the shell regions 30 and the compositional layers 30A, 30B. To this extent, a top portion of the ohmic contacts 64 is located above the dielectric layer 66.

The dielectric layer 66 can be formed from a material that is transparent to a target radiation at a normal incidence to the dielectric layer. For example, the dielectric layer 66 can be formed from materials that include, but are not limited to, $SiO_2$, AAO, $CaF_2$, $MgF_2$, sapphire AlN, and/or the like. In one embodiment, the dielectric layer 66 can have a transparency that is at least 30% transparent to the target radiation at a normal incidence to the dielectric layer.

As shown in FIG. 11, the opto-electronic device 62 can also include a reflective metallic contact layer 68 that can reflect the target radiation, and improve light extraction/light absorption efficiency of the opto-electronic device. The reflective metallic contact layer 68 can cover the top portions of the ohmic contacts 64 and the portions of the dielectric layer 66 that are formed between the tilted semiconductor heterostructures 12. The reflective metallic contact layer 68 can be formed from materials that include, but are not limited to, Al, Rd, and/or Pt. In one embodiment, the reflective metallic contact layer 68 can include a multilayer metallic film. An example of a multilayer metallic film can include, but is not limited to, Rhodium, Palladium, and/or Aluminum alloys.

In another embodiment, a reflective mirror can be formed over the set of tilted semiconductor heterostructures 12 prior to the formation of the reflective metallic contact layer 68. In particular, the reflective mirror can cover the top portions of the ohmic contacts 64 and the portions of the dielectric layer 66 that are formed between the tilted semiconductor heterostructures 12. The reflective metallic contact layer 68 can then be formed over the reflective mirror. In this manner, the reflective mirror can improve the reflective properties of the reflective metallic contact layer 68. In one embodiment, the reflective mirror can include a Bragg reflective mirror.

Figure 12:
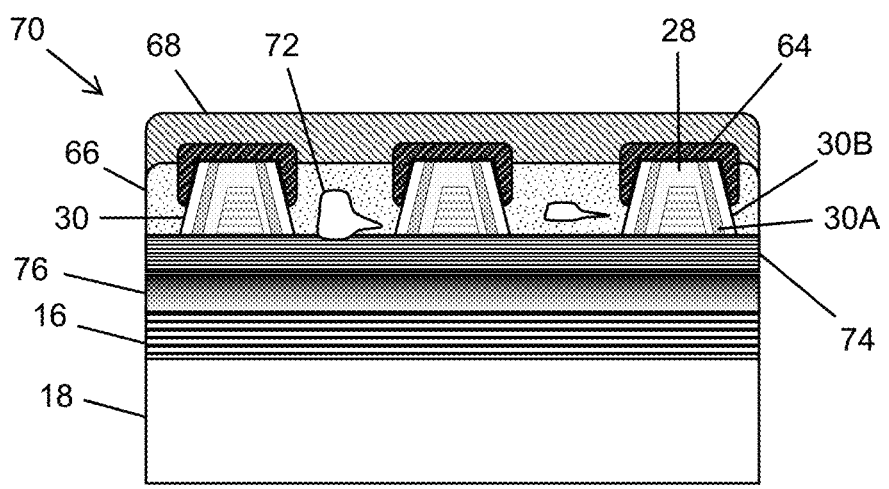
FIG. 12 shows an alternative to the opto-electronic device of FIG. 11 in which light scattering elements are formed in the dielectric layer according to an embodiment.

FIG. 12 shows a cross-sectional view of an opto-electronic device 70 that is also similar to the opto-electronic device 62 of FIG. 11, although any combination of one or more of the unique features shown can be implemented on any embodiment described herein. In this embodiment, the opto-electronic device 70 can include light scattering elements 72 formed in the dielectric layer 66 to further improve light extraction efficiency from the device and reduce absorption of the light due to total internal reflection. In general, the light scattering elements 72 can scatter light that is at least 10% Lambertian. The light scattering elements 72 can include, but are not limited to, voids, and amorphous dielectric materials such as $SiO_2$, $CaF_2$, $MgF_2$, sapphire, AAO and/or the like. As shown in FIG. 12, the light scattering elements 72 can have different shapes, sizes (e.g., thicknesses) and profiles.

The opto-electronic device 70 of FIG. 12 can further include a SPSL 74 having a plurality of barriers alternating with a plurality of quantum wells and a semiconductor layer 76 formed between the set of tilted semiconductor heterostructures 12 and the light generating structure 16. As shown in FIG. 12, the SPSL 74 has a surface that directly contacts a bottom surface of each of the tilted semiconductor heterostructures 12 and a bottom surface of the dielectric layer 66. An opposing surface of the SPSL 74 directly contacts a surface of the semiconductor layer 76. The other surface of the semiconductor layer 76 is in immediate contact with a surface of the light generating structure 16. In this configuration, the SPSL 74 serves to spread the holes injected from hole injection zones over the entire area of the active region. In addition, such a structure can partially reflect target radiation from the active region and help light extraction from the device. The semiconductor layer 76 can serve to reduce the mechanical stresses exerted on active layer. In addition, the semiconductor layer 76 can contain an electron blocking layer, as well as a layer for further spreading and distributing holes over a lateral area of the active layer.

The SPSL 74 and its set of barriers alternating with the set of quantum wells can include, but is not limited to, group III-V materials. The composition of the SPSL 74 including the barriers and wells can include a constant composition or a graded composition. In one embodiment, the SPSL 74 including the barriers and wells can include, a SPSL comprising $Al_xGa_{1-x}N/Al_yGa_{1-y}N$ layer with molar fraction x being different from molar fraction y.

The semiconductor layer 76 can include, but is not limited to, $B_WAl_XGa_YIn_ZN$, where $0 \leq W, X, Y, Z \leq 1$, and $W+X+Y+Z=1$. In one embodiment, the semiconductor layer 76 can include any of the aforementioned group III-V materials. For example, the semiconductor layer 76 can include, an $Al_xGa_{1-x}N$ semiconductor layer. The semiconductor layer 76 can have a graded composition or a constant composition. It is understood that the function of the semiconductor layer 76 is subject to the doping of the various other layers in the opto-electronic device 70. For example, in embodiments in which the tilted semiconductor heterostructure are of a p-type, then the semiconductor layer 76 can act as an electron blocking layer adjacent to the light generating structure 16.

Figure 13:
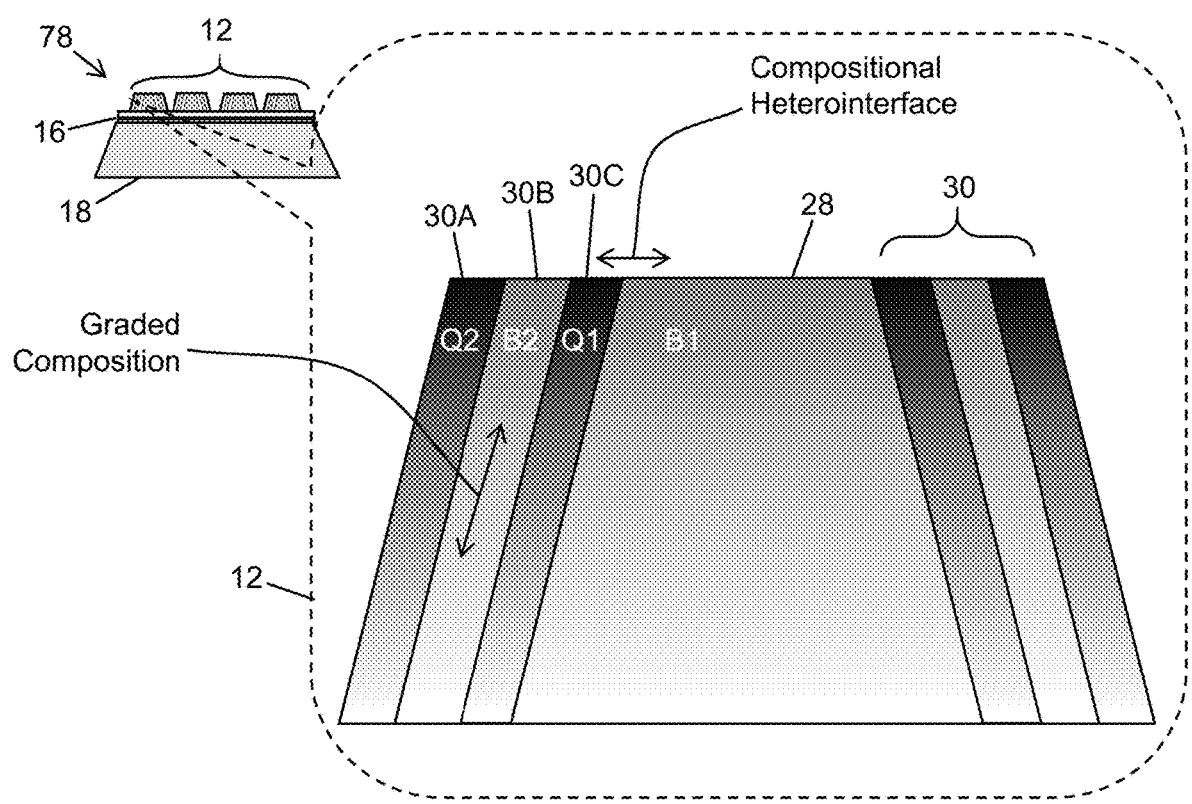
FIG. 13 shows another detailed cross-sectional view of one of the tilted semiconductor heterostructures in which the compositional layers of the shell region have graded compositions of material that vary in a vertical direction according to an embodiment.

FIG. 13 shows another detailed cross-sectional view of one of the tilted semiconductor heterostructures 12 in an opto-electronic device 78 in which the compositional layers 30A, 30B, 30C of the shell region 30 have a graded composition of material that varies in a vertical direction according to an embodiment. A graded composition as used herein means a composition with the molar ratio varying continuously as a function of coordinate z, wherein coordinate z is directed normal to the semiconductor layer lateral area. As noted above, each of the compositional layers (30A, 30B, 30C) can have a different composition or different molar fraction of material (e.g., group III-V material) from an immediately adjacent compositional layer. The difference in composition between the compositional layers 30A, 30B, and 30C causes a 2DG to be formed at the heterointerface between each of the layers having different composition. A 2DG gas is also formed at the heterointerface between the compositional layer 30C and the core region 28 due to the difference in composition.

In FIG. 13, the composition of the compositional layers 30A, 30B, 30C are represented by Q2, B2, Q1, respectively, while the compositional of the core region 28 is represented by B1. At least one of the compositions Q2, B2, Q1, B1 can have a graded composition that varies in a vertical direction as denoted by the directional arrow in FIG. 13. In one embodiment, the compositions Q2 and Q1 can have a higher concentration of material in comparison to the compositions of the material in B2 and B1. For example, in a scenario where the compositional layers 30A, 30B, 30C and the core region 28 include a group III nitride material, such as AlN, the compositions Q2 and Q1 can have a higher concentration of the AlN in comparison to the compositions of the AlN in B2 and B1. It is understood that other group III-V materials can be used for the compositional layers 30A, 30B, 30C and the core region 28, and the example of AlN is not meant to limit the scope of the various embodiments described herein.

The vertically graded composition of the compositional layers 30A, 30B, 30C and the core region 28 not only contributes to the formation of the 2DG layers at the heterointerfaces between the materials of different composition, but the grading of the composition of these layers can result in a polarization doping of the tilted semiconductor heterostructure 12 as it is known in art. For example, in the scenario where the set of tilted heterostructures 12 act as a hole supply layer, the graded composition of the various regions in a heterostructure will result in a p-type polarization doping. Alternatively, if the set of tilted heterostructures 12 act as an electron supply layer, the graded composition of the various regions in a heterostructure would result in an n-type polarization doping.

Figure 14:
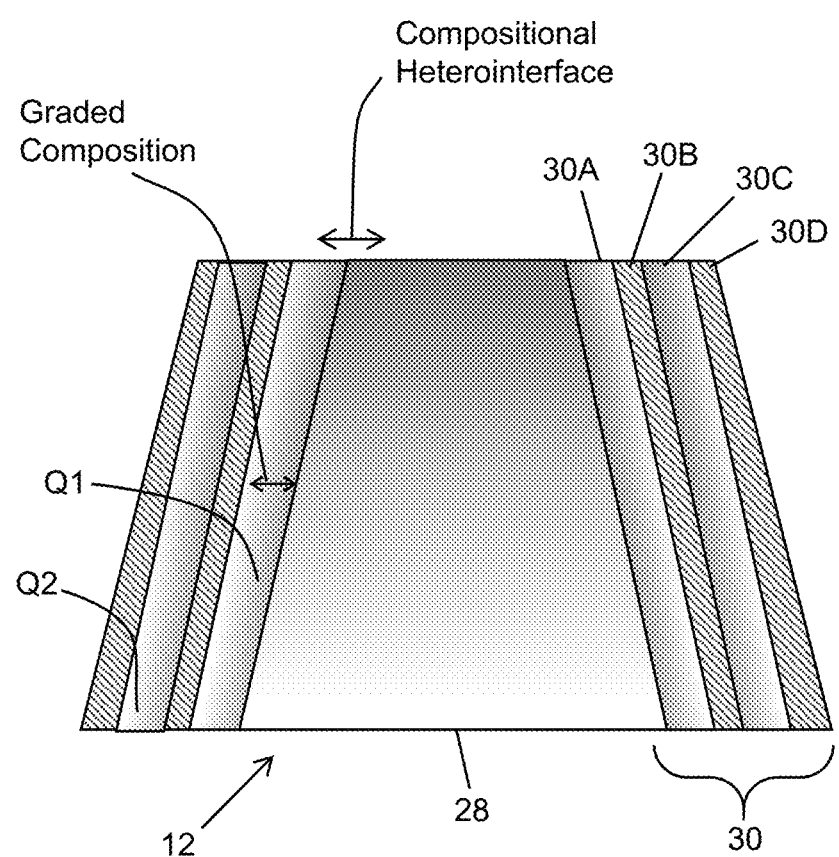
FIG. 14 shows another detailed cross-sectional view of one of the tilted semiconductor heterostructures in which the compositional layers of the shell region have graded compositions of material that vary in a lateral direction according to an embodiment.

The grading of composition of the compositional layers and the core region of a tilted semiconductor heterostructure are not limited to grading in a vertical direction. In one embodiment, the compositional layers of the shell region and the core region of a tilted semiconductor heterostructure can include having at least one of the layers with a composition that is graded in a lateral direction. FIG. 14 shows a detailed cross-sectional view of one of the tilted semiconductor heterostructures 12 in which the compositional layers of the shell region have a graded composition of material that varies in a lateral direction according to an embodiment. A tilted semiconductor heterostructure 12 with any of the regions having a grading that extends in a lateral direction will modify the bandgap structure of the heterostructure 12. In particular, the graded composition can result in a hole accumulation layer that is spread through a volume domain due to polarization doping. Such volume accumulation layers are known in art.

Figure 15A:
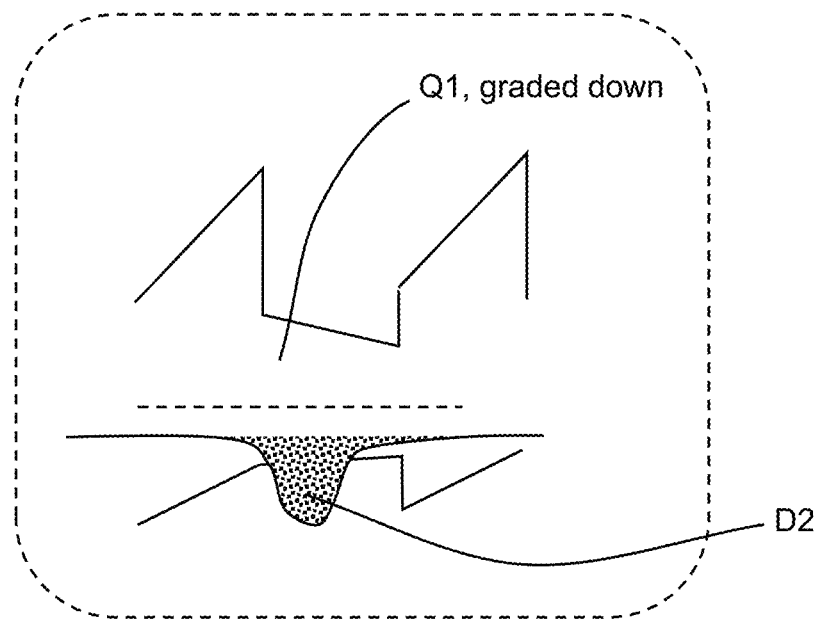
FIGS. 15A-15B show the effect that a heterostructure with and without a graded composition of material has on the spreading of a 2DG layer as represented by the carrier density profiles in the figures according to an embodiment.
Figure 15B:
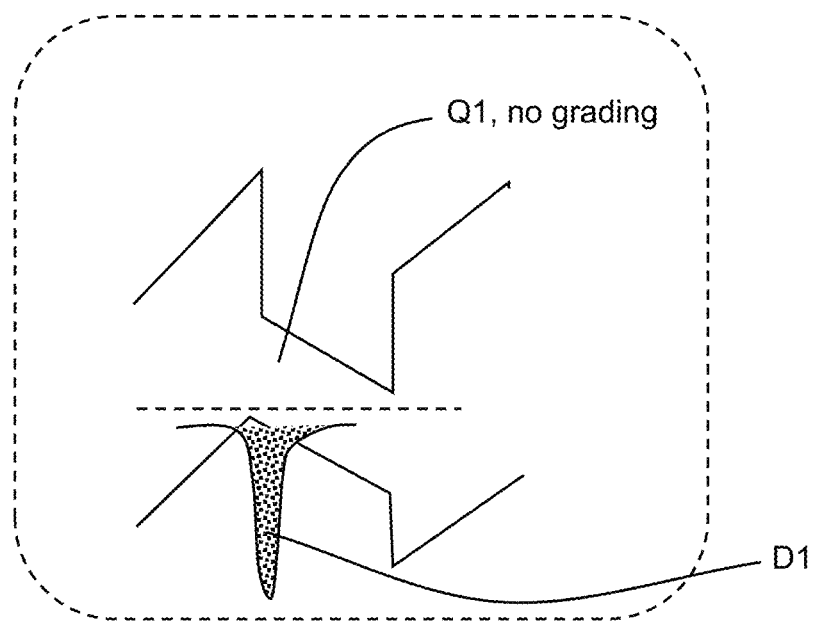

The effect that a layer with a graded composition in a lateral direction will have on the bandgap structure of a heterostructure is illustrated in FIGS. 15A-15B. In particular, FIGS. 15A-15B show the effect that a heterostructure with and without a laterally graded composition. The lateral grading of group III nitride semiconductor material results in the spreading of a 2DHG layer as represented by the carrier density profiles in the figures according to an embodiment. More specifically, FIG. 15A shows the bandgap structure for a composition layer having a composition of a material Q1 that is graded, while FIG. 15B shows the bandgap structure for a layer Q1 having no grading. As can be seen from FIG. 15A, the grading of Q1 results in spread of accumulated holes throughout the volume of Q1 layer, while without grading, the holes are more localized over a portion of a Q1 layer as shown in FIG. 15B.

As shown in FIGS. 15A-15B, the grading of a layer in a region of the tilted semiconductor heterostructure 12 results in a wider carrier density profile (D2 in FIG. 15A), while an ungraded layer results in a narrower carrier density profile (D1 in FIG. 15B). As a result, those skilled in the art will appreciate that the grading of a region within a tilted semiconductor heterostructure 12 can be used control the spreading of the 2DG at the heterointerfaces with other layers. Note, that the exact grading control of the layers with the materials Q1 and Q2, respectively, depends on the growth process of such semiconductor layers, and in general, can result in a grading that is not exactly as shown in FIGS. 13-14, but can comprise a grading that extends in both vertical and lateral directions.

In addition to affecting the electrical properties of the tilted semiconductor heterostructures 12, the shape, size and composition of the core region 28 and the shell region 30 including any compositional layers can have a role in the optical properties that are attained with the tilted semiconductor heterostructures 12. For example, the optical properties of the tilted semiconductor heterostructures 12 can be controlled by correctly selecting the composition and thicknesses of the layers that form each of the heterostructures.

Figure 16:
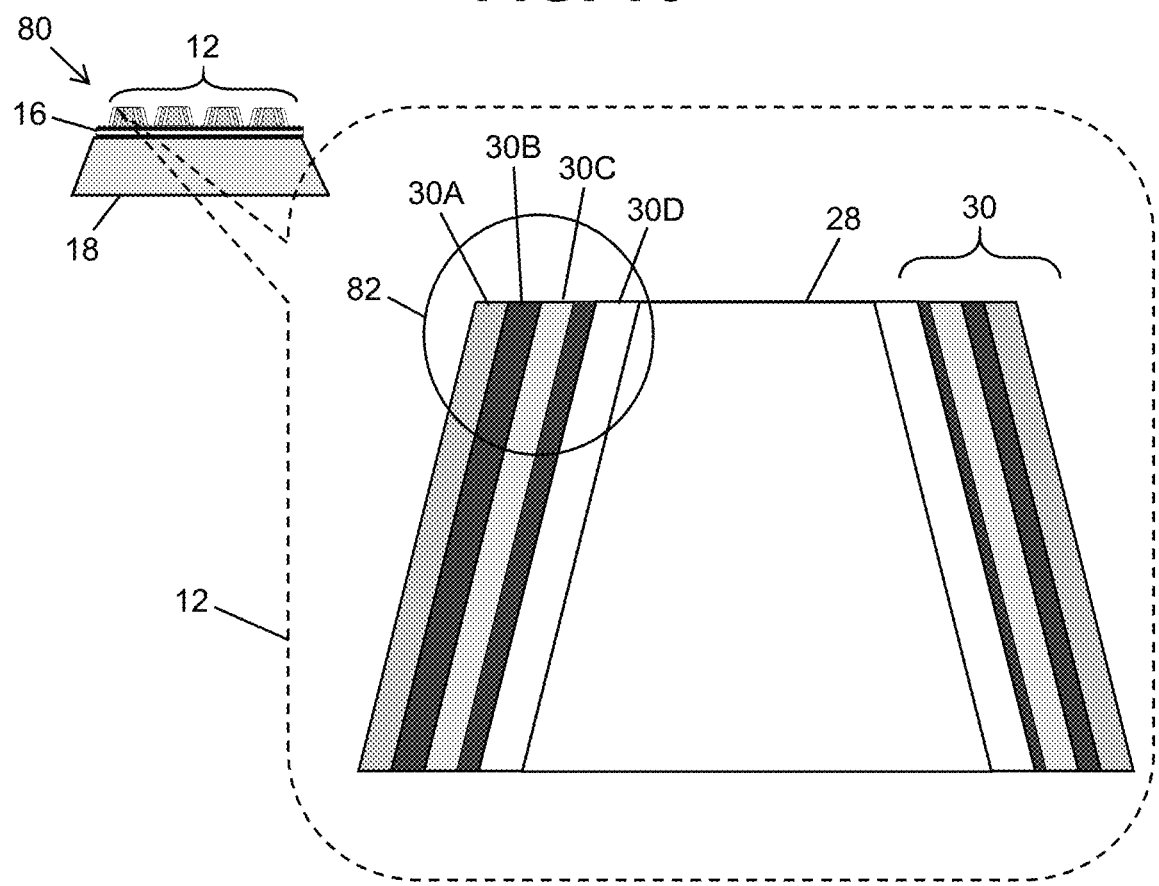
FIG. 16 shows another detailed cross-sectional view of one of the tilted semiconductor heterostructures in which the core region is transparent and the compositional layers of the shell region form a Bragg reflector structure according to an embodiment.

In one embodiment, the compositional layers of the shell region can be designed to form a Bragg reflector structure that can partially reflect the light and increase the light extraction efficiency of the device. FIG. 16 shows a detailed cross-sectional view of one of the tilted semiconductor heterostructures 12 in an opto-electronic device 80 in which the compositional layers 30A, 30B, 30C, 30D of the shell region 30 form a Bragg reflector structure 82 through selecting the thickness and composition of each layer. In particular, each layer can have a thickness of approximately one quarter of a target wavelength, be partially transparent to target radiation, and have refractive index change between the layers 30A, 30B, 30C and 30D.

In another embodiment, the compositional layers of the shell region can be designed to form a graded refractive index structure for improved light extraction from such regions. In particular, the compositional layers 30A, 30B, 30C, 30D can form the graded refractive index structure in the shell region 30 by selecting a molar ratio for each layer to have an appropriate index of refraction. For example, the layer 30A can have an index of refraction $N_a$, layer 30B an index of refraction $N_b$, layer 30C an index of refraction $N_c$, and layer 30D an index of refraction $N_d$, such that $N_d > N_c > N_b > N_a$. In one embodiment, a shell 30 can comprise a single graded layer with a molar fraction changing in a lateral direction to result in graded index of refraction $N_g$, such that $N_g$ is smallest at the ambient/material interface and largest at the shell/core interface.

For either embodiment in which the tilted semiconductor heterostructures 12 include the Bragg reflector structure 82 or the graded refractive index structure, the core region 28 of each heterostructure can be transparent to a targeted radiation at a normal incidence to the core region. In one embodiment, the core region 28 of the heterostructure 12 can have a transparency that is at least 30% transparent for the light propagated normal to the base of the heterostructure throughout the height of the structure.

Figure 17:
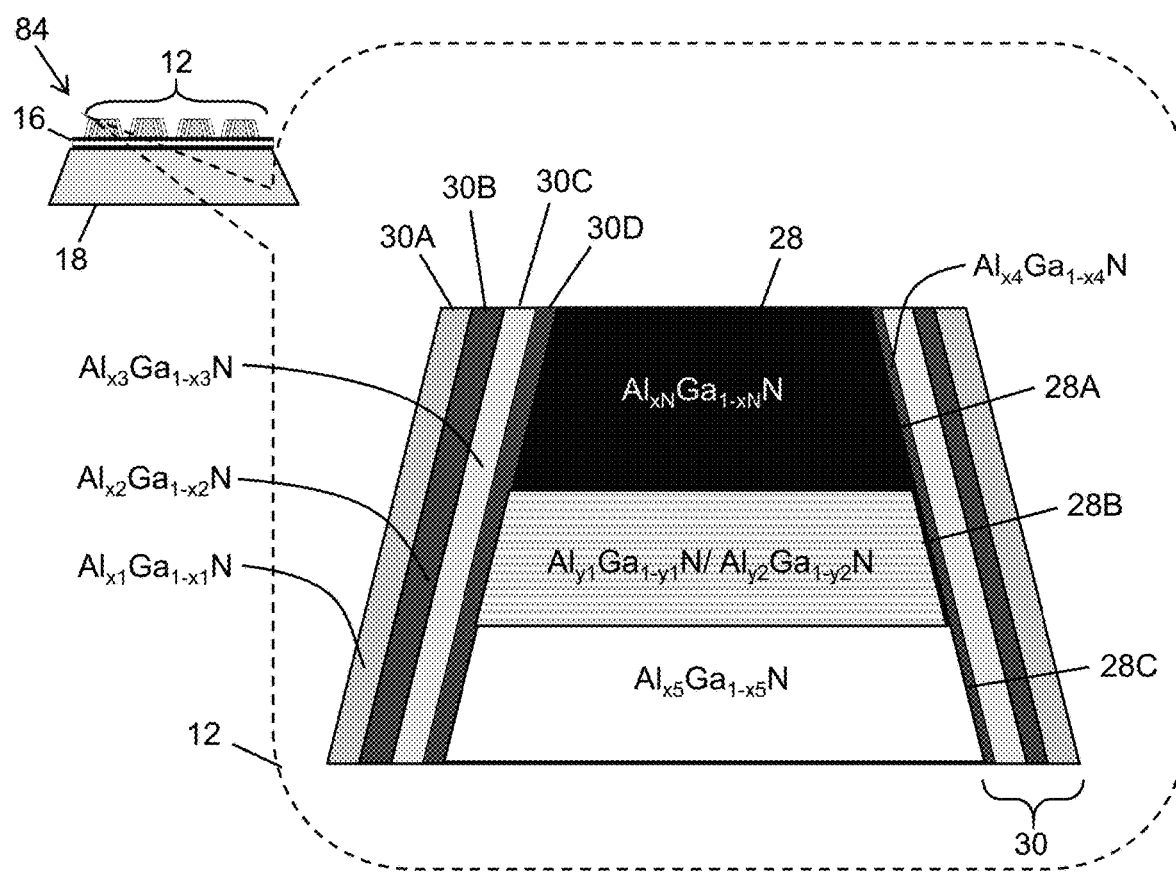
FIG. 17 shows another detailed cross-sectional view of one of the tilted semiconductor heterostructures in which the core region includes a plurality of core regions adjoined by shell regions having a plurality of compositional layers according to an embodiment.

FIG. 17 shows a detailed cross-sectional view of one of the tilted semiconductor heterostructures 12 in an opto-electronic device 84 in which the core region 28 includes a plurality of core regions 28A, 28B, 28C adjoined by shell regions 30 having a plurality of compositional layers 30A, 30B, 30C, 30D according to an embodiment. Having a core region 28 with a multiple of core regions 28A, 28B, 28C in conjunction with shell regions 30 having a multiple of compositional layers 30A, 30B, 30C, 30D adjoining the core regions can be useful in optimizing both light extraction characteristics of the opto-electronic device 84, as well as the conductivity of the set of tilted semiconductor heterostructures 12. In particular, each core region can serve its purpose for the efficient operation of the device. For instance, one core region (28C) can comprise a semiconductor spreading layer used to evenly spread holes throughout the active layer. In some instances, the core region 28C can comprise a region designed to reduce mechanical stresses on the active region. In an embodiment, the core region 28C can comprise a compositionally graded region (wherein the grading is in the layer normal direction), resulting in polarization doping. In an embodiment, such a region can further comprise a sub-region being an electron blocking layer, where the electron blocking layer has a wider band gap than the active region layer. The core region 28B can comprise a partially transparent/conductive region for promoting hole conductivity through the core. Such a region can comprise an $Al_{y1}Ga_{1-y1}N/Al_{y2}Ga_{1-y2}N$ superlattice. In addition, such a region can promote light extraction by having superlattice layers selected to result in partial reflection of target radiation. The core region 28A can comprise a heavily p-type doped semiconductor layer designed to form and adequate ohmic contact with a metallic contact layer.

In one embodiment, optimization can be attained by optimizing the wall plug efficiency of the opto-electronic device 84 including the set of tilted semiconductor heterostructures 12 which entails selecting the lateral, vertical size of the tilted semiconductor structures, as well as selecting the tilt inclination (e.g., the shape of the semiconductor structures 12). Additional parameters can include the thickness, composition, and number of shell layers. The optimal parameters for optimizing the wall plug efficiency can be determined through iterations of parameters using numerical modeling. For optimization, it is frequently important to optimize the wall plug efficiency of a device containing conical structures, and optimal parameters can be found through iterations of parameters using numerical modeling.

The multiple of core regions 28A, 28B, 28C and compositional layers 30A, 30B, 30C, 30D in the heterostructure 12 of FIG. 17 can include different compositions of any of the aforementioned materials. For example, the multiple of core regions 28A, 28B, 28C and compositional layers 30A, 30B, 30C, 30D in the heterostructure 12 can include a group III-V material. In one embodiment, the multiple of core regions 28A, 28B, 28C and compositional layers 30A, 30B, 30C, 30D can include AlGaN such that each layer is represented by the $Al_xGa_{1-x}N$ system. For example, as shown in FIG. 17, the compositional layers 30A, 30B, 30C, 30D can be represented by $Al_{x1}Ga_{1-x1}N$, $Al_{x2}Ga_{1-x2}N$, $Al_{x3}Ga_{1-x3}N$, $Al_{x4}Ga_{1-x4}N$, respectively, while the core regions 28A, 28B, 28C can be represented by $Al_{xN}Ga_{1-xN}N$, $Al_{y1}Ga_{1-y1}N/Al_{y2}Ga_{1-y2}N$, $Al_{x5}Ga_{1-x5}N$, respectively. In an embodiment, $x_N$ can be chosen to be 0, and y1 and y2 can range between 0.1 and 0.9. In an embodiment, the molar fraction x5 can depend on the growth coordinate z and vary between 1 and 0.

Figure 18:
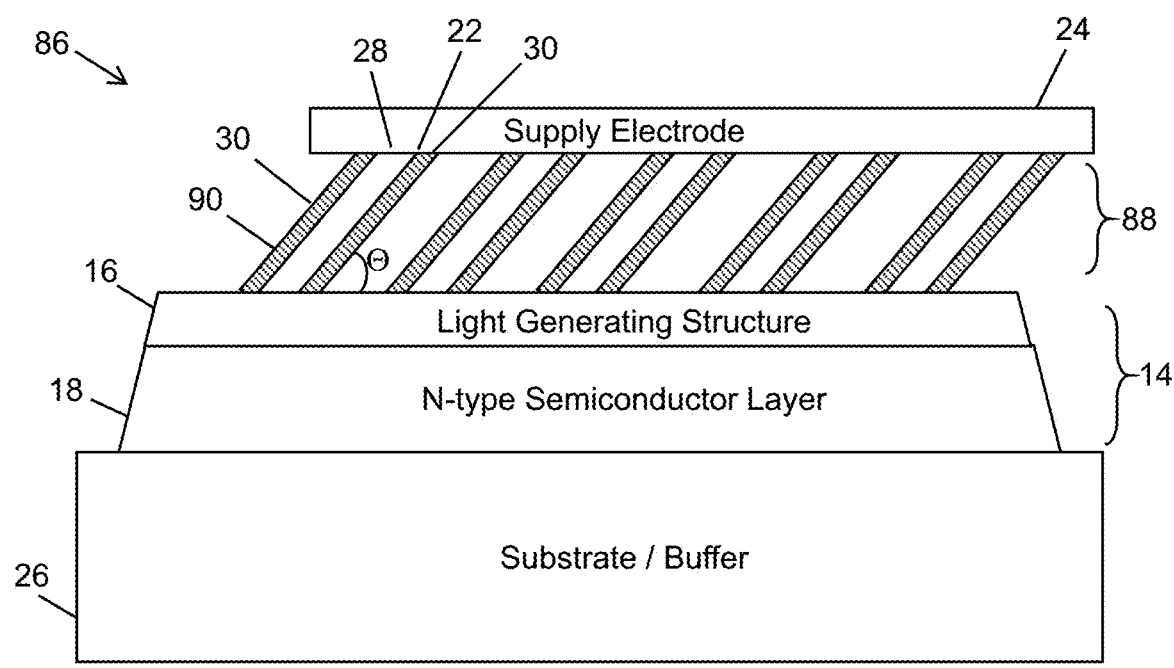
FIG. 18 shows a cross-sectional view of an opto-electronic device having a plurality of tilted semiconductor heterostructures formed from a plurality of nanowires in which each nanowire includes 2DG layers at a heterointerface between two materials with different compositions according to an embodiment.

FIG. 18 shows a cross-sectional view of an opto-electronic device 86 having a plurality of tilted semiconductor heterostructures 88 formed from a plurality of nanowires 90 in which each nanowire includes 2DG layers at a heterointerface between two materials with different compositions according to an embodiment. In FIG. 18, the plurality of tilted semiconductor heterostructures 88 can be formed over the semiconductor structure 14 having a light generating structure 16 and an n-type semiconductor layer 18, in which each heterostructure 12 includes 2DG layers at the heterointerface 22 between two materials with different compositions according to an embodiment. In addition, the set of tilted semiconductor heterostructures 88 can be formed between the light generating structure 16 and the supply electrode 24, while the n-type semiconductor layer 18 of the semiconductor structure 14 can be formed on the substrate/buffer 26.

Each tilted semiconductor heterostructure 88 formed from a nanowire 90 can include a core region 28, a set of shell regions 30, with each shell region adjoining a sidewall of the core region. The sidewalls of the core region 28, and the pair of shell regions 30 at the heterointerface 22 each have a sloping surface.

The light generating structure 16 can form the active region of the opto-electronic device 86. In one embodiment, the light generating structure 16 can include a multi-quantum well structure having a set of barrier layers alternating with a set of well layers. In the embodiment depicted in FIG. 18, the n-type semiconductor layer 18 can form an electron supply layer, while the set of tilted semiconductor heterostructures 88 formed from nanowires can form a hole supply layer. In this manner, the light generating structure 16, the n-type semiconductor layer 18, and the set of tilted semiconductor heterostructures 88 form a heterostructure within the opto-electronic device 86 that serves as the active p-n junction region for electron-hole pair recombination and light emission. The supply electrode 24, which can be a metal electrode, acts as the anode side of the opto-electronic device 86. A source (not shown) applied to the supply electrode 24 can drive electrons from the n-type semiconductor layer 18 to the light generating structure 16 and holes in the 2DG layers at the heterointerfaces 22 of the tilted semiconductor heterostructures 12 to the light generating structure 16 for electron-hole pair recombination and light emission therefrom.

Each of the titled semiconductor heterostructures 88 formed from the nanowires 90 can include regions have materials with different compositions. In particular, the core region 28 and the pair of shell regions 30 of the tilted semiconductor heterostructures can include materials with different compositions. Having the core region 28 and the pair of shell regions 30 with materials different compositions leads to the realization of the 2DG layers.

The core region 28 and the pair of shell regions 30 can include any of the aforementioned group III-V materials. As mentioned above, the group III-V material for the core region 28 and the pair of shell regions 30 can include a group III nitride material. For example, the group III nitride material can represented by the $Al_xGa_{1-x}N$ system. In one embodiment, the pair of shell regions 30 can have a different composition of Al than the composition of Al in the core region 28. For example, the core region 28 can contain a higher concentration or molarity of Al and the pair of shell regions 30 can have a lower concentration or molarity of Al. In one embodiment, the first AlN molar ratio in the core region 28 can be greater than the second AlN molar ratio in the shell regions 30.

The tilted features of the semiconductor heterostructures 88 formed from the nanowires 90 include having the tilted surface of the sidewalls of the core region 28 and the pair of shell regions 30 formed at the heterointerfaces 22 slope increasingly inward from a surface of the light generating structure 16 to a surface of the supply electrode 24. These tilted features allows the 2DG layers to contact a surface of the light generating structure 16 and the supply electrode 24. As described above with respect to FIG. 1, the nanowires can form an angle θ with a surface of the light generating structure 16. In one embodiment, the angle θ can range from 30 degrees to 60 degrees. It is understood that the nanowires 90 can be grown under the angle θ with respect to the light generating structure 16.

In operation, a source applied to the supply electrode 24 can drive electrons from the n-type semiconductor layer 18 to the light generating structure 16 and holes in the 2DG layers at the heterointerfaces 22 of the tilted semiconductor heterostructures 88 to the light generating structure 16 for electron-hole pair recombination and light emission therefrom. In this embodiment, because holes are injected from the set of the tilted semiconductor structures 88, the 2DG layers formed at the heterointerfaces of different compositions of material, act as 2DHG layers.

It is understood that the implementation depicted in FIG. 18 is only representative of one possibility and is not meant to limit the scope of the various embodiments. For example, the n-type semiconductor layer 18 can be replaced by a p-type semiconductor layer. In this manner, the set of tilted semiconductor heterostructures 88 formed of nanowires 90 can act as an electron supply layer and the heterointerfaces formed at the different compositions of material act as 2DEG layers. The holes and electrons recombine in the light generating structure for electron-hole pair recombination and light emission.

Figure 19:
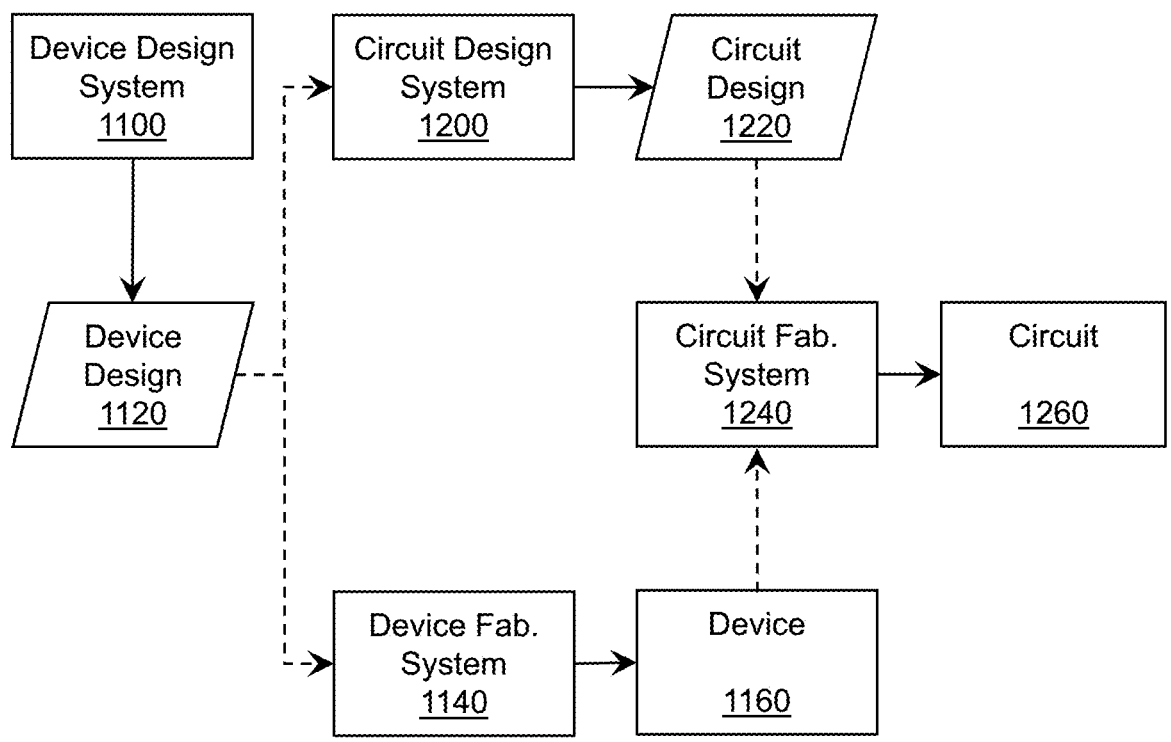
FIG. 19 shows an illustrative flow diagram for fabricating opto-electronic devices having a set of tilted semiconductor heterostructures according to one of the various embodiments described herein.

In one embodiment, the invention provides a method of designing and/or fabricating a circuit that includes one or more of the opto-electronic devices with tilted semiconductor heterostructures designed and fabricated as described herein. To this extent, FIG. 19 shows an illustrative flow diagram for fabricating a circuit 1260 according to an embodiment. Initially, a user can utilize a device design system 1100 to generate a device design 1120 for a semiconductor device as described herein. The device design 1120 can comprise program code, which can be used by a device fabrication system 1140 to generate a set of physical devices 1160 according to the features defined by the device design 1120. Similarly, the device design 1120 can be provided to a circuit design system 1200 (e.g., as an available component for use in circuits), which a user can utilize to generate a circuit design 1220 (e.g., by connecting one or more inputs and outputs to various devices included in a circuit). The circuit design 1220 can comprise program code that includes a device designed as described herein. In any event, the circuit design 1220 and/or one or more physical devices 1160 can be provided to a circuit fabrication system 1240, which can generate a physical circuit 1260 according to the circuit design 1220. The physical circuit 1260 can include one or more devices 1160 designed as described herein.

In another embodiment, the invention provides a device design system 1100 for designing and/or a device fabrication system 1140 for fabricating a semiconductor device 1160 as described herein. In this case, the system 1100, 1140 can comprise a general purpose computing device, which is programmed to implement a method of designing and/or fabricating the semiconductor device 1160 as described herein. Similarly, an embodiment of the invention provides a circuit design system 1200 for designing and/or a circuit fabrication system 1240 for fabricating a circuit 1260 that includes at least one device 1160 designed and/or fabricated as described herein. In this case, the system 1200, 1240 can comprise a general purpose computing device, which is programmed to implement a method of designing and/or fabricating the circuit 1260 including at least one semiconductor device 1160 as described herein. In either case, the corresponding fabrication system 1140, 1240, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1100 to generate the device design 1120 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1100 for designing and/or a device fabrication system 1140 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3)

incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
    a semiconductor structure comprising:
        an n-type semiconductor layer;
        a light generating structure located over the n-type semiconductor layer; and
        a p-type semiconductor layer located over the light generating structure, the p-type semiconductor layer including at least one semiconductor heterostructure having at least two layers of different aluminum nitride composition with an interface formed between the at least two layers of different aluminum nitride composition, wherein the interface is inclined relative to a plane passing through the light generating structure.

2. The device of claim 1, wherein the at least one semiconductor heterostructure comprises a plurality of interfaces, each of the plurality of interfaces formed between layers of different aluminum nitride composition, wherein each of the plurality of interfaces is distinct from one another.

3. The device of claim 1, wherein the at least one semiconductor heterostructure comprises a pyramid-shaped structure with a base portion, a top portion, side portions connecting the base portion to the top portion, and a core portion enclosed by the base portion, the top portion and the side portions, wherein each side portion is parallel to at least one interface.

4. The device of claim 3, wherein the core portion and the side portions of the pyramid-shaped structure each comprises aluminum nitride, and wherein the core portion has an aluminum nitride composition that is greater than an aluminum nitride composition of the side portions.

5. The device of claim 3, wherein each side portion comprises a plurality of compositional layers that extend laterally away from the core portion, each compositional layer having a different composition from an immediately adjacent compositional layer, wherein an interface is formed between each of the compositional layers.

6. The device of claim 3, wherein the at least one semiconductor heterostructure comprises a plurality of the pyramid-shaped structures, wherein each pyramid-shape structure is separated from an adjacent pyramid-shape structure by a predetermined spacing.

7. The device of claim 6, further comprising a dielectric layer formed in the spacing between each of the plurality of pyramid-shaped structures.

8. The device of claim 7, wherein the device comprises an opto-electronic device configured to operate at a target wavelength, and wherein the dielectric layer comprises a material transparent to radiation of the target wavelength.

9. The device of claim 7, further comprising light scattering elements formed in the dielectric layer, wherein the light scattering elements scatter light that is at least 10% Lambertian.

10. The device of claim 6, further comprising a supply electrode formed over the plurality of pyramid-shaped structures.

11. The device of claim 10, wherein the interfaces in each of the pyramid-shaped structures contacts the light generating structure and the supply electrode.

12. The device of claim 11, wherein the interfaces slope increasingly inward from the light generating structure to a surface of the supply electrode.

13. The device of claim 6, wherein each of the plurality of pyramid-shaped structures comprises a p-type doped group III nitride semiconductor material.

14. The device of claim 3, wherein each interface is formed between a sidewall of the core portion and each of the side portions, producing a two-dimensional carrier accumulation (2DCA) layer, wherein the sidewall of the core portion, the side portions and the 2DCA layers each have a sloping surface, wherein each 2DCA layer forms an angle with a surface of the light generating structure, the angle ranging from 30 degrees to 60 degrees.

15. The device of claim 14, wherein a two-dimensional hole gas (2DHG) is formed in each 2DCA layer.

16. The device of claim 1, wherein at least some layers within the at least one semiconductor heterostructure of the p-type semiconductor layer comprise compositional grading.

17. A device, comprising:
    a semiconductor structure comprising:
        an n-type semiconductor layer;
        a light generating structure located over the n-type semiconductor layer; and
        a p-type semiconductor layer located over the light generating structure, the p-type semiconductor layer including a set of spaced mesa structures, each mesa structure having a flat base portion, a flat top portion, side portions connecting the base portion to the top portion, and a core portion enclosed by the base portion, the top portion and the side portions, wherein the core portion and the side portions each includes a group III-V material, wherein the core portion has a composition of the group III-V material that differs from the composition of the group III-V material in each of the side portions, the difference in composition of the group III-V material forming an interface between the core portion and each of the side portions, wherein the interface is inclined relative to a plane passing through the light generating structure; and
    a dielectric layer formed in the spacing between each of the plurality of mesa structures.

18. The device of claim 17, wherein each side portion comprises a plurality of compositional layers that extend laterally away from the core portion, each compositional layer having a different composition from an immediately adjacent compositional layer, wherein an interface is formed between each of the compositional layers.

19. The device of claim 17, wherein the core portion comprises a multilayered structure of horizontally extending layers, wherein the multilayered structure comprises a short period superlattice (SPSL) having a plurality of barriers alternating with a plurality of quantum wells.

20. A device, comprising:
    a semiconductor structure comprising:
        an n-type semiconductor layer;
        a light generating structure located over the n-type semiconductor layer; and a p-type semiconductor layer located over the light generating structure, the p-type semiconductor layer including a set of spaced semiconductor heterostructures, each heterostructure having a core portion with inclined sidewalls and side portions adjoining each of the inclined sidewalls of the core portion, wherein the core portion and the side portions each includes a group III nitride material, wherein the core portion has a composition of the group III nitride material that differs from the composition of the group III nitride material in each of the side portions, the difference in composition of the group III-V material forming an inclined interface between the core portion and each of the side portions;

a plurality of ohmic contacts formed over the set of heterostructures, wherein each ohmic contact is formed on one of the heterostructures, the ohmic contact extending along a top surface of both the core portion and the side portions; and a dielectric layer formed in the spacing between each of the heterostructures and corresponding ohmic contacts.

* * * * *